(12) United States Patent
Asano et al.

(10) Patent No.: US 9,703,199 B2
(45) Date of Patent: *Jul. 11, 2017

(54) SUBSTRATE PROCESSING APPARATUS

(71) Applicant: SCREEN SEMICONDUCTOR SOLUTIONS CO., LTD., Kyoto (JP)

(72) Inventors: Toru Asano, Kyoto (JP); Yukio Toriyama, Kyoto (JP); Takashi Taguchi, Kyoto (JP); Tsuyoshi Mitsuhashi, Kyoto (JP)

(73) Assignee: SCREEN Semiconductor Solutions Co., Ltd., Kyoto (JP)

( * ) Notice: Subject to any disclaimer, the term of this patent is extended or adjusted under 35 U.S.C. 154(b) by 326 days.

This patent is subject to a terminal disclaimer.

(21) Appl. No.: 14/149,026

(22) Filed: Jan. 7, 2014

(65) Prior Publication Data
US 2014/0120477 A1 May 1, 2014

Related U.S. Application Data

(62) Division of application No. 12/698,862, filed on Feb. 2, 2010, now abandoned, which is a division of
(Continued)

(30) Foreign Application Priority Data

Dec. 6, 2004 (JP) ................................ 2004-353120
Mar. 29, 2005 (JP) ................................ 2005-095783
Sep. 14, 2005 (JP) ................................ 2005-267331

(51) Int. Cl.
G03F 7/30 (2006.01)
H01L 21/67 (2006.01)

(52) U.S. Cl.
CPC .......... G03F 7/30 (2013.01); H01L 21/67028 (2013.01); H01L 21/67034 (2013.01);
(Continued)

(58) Field of Classification Search
None
See application file for complete search history.

(56) References Cited

U.S. PATENT DOCUMENTS 3,961,100 A 6/1976 Harris et al.
4,751,170 A 6/1988 Mimura et al.
(Continued)

FOREIGN PATENT DOCUMENTS

CN 1385882 A 12/2002
CN 1440055 9/2003
(Continued)

OTHER PUBLICATIONS

Non-Final Office Action, dated Mar. 27, 2015, for U.S. Appl. No. 12/698,862, filed Feb. 2, 2010, 24 pages.
(Continued)

Primary Examiner — Joel Horning
(74) Attorney, Agent, or Firm — Kilpatrick Townsend & Stockton LLP

(57) ABSTRACT

A method of processing a substrate in a substrate processing apparatus that is arranged adjacent to an exposure device and includes first, second and third processing units, includes forming a photosensitive film on the substrate by said first processing unit before exposure processing by said exposure device and applying washing processing to the substrate by supplying a washing liquid to the substrate in said second processing unit after the formation of said photosensitive film and before the exposure processing. The method also includes applying drying processing to the substrate in said second processing unit after the washing processing by said second processing unit and before the exposure processing and applying development processing to the substrate by said third processing unit after the exposure processing. Applying the drying processing to the
(Continued)

substrate includes the step of supplying an inert gas onto the substrate, to which the washing liquid is supplied.

5 Claims, 14 Drawing Sheets

Related U.S. Application Data application No. 11/295,216, filed on Dec. 6, 2005, now abandoned.

(52) U.S. Cl.
CPC .. *H01L 21/67051* (2013.01); *H01L 21/67178* (2013.01); *H01L 21/67225* (2013.01)

(56) References Cited

U.S. PATENT DOCUMENTS

| | | |
|---|---|---|
| 4,840,874 A | 6/1989 | Shigemitsu et al. |
| 4,985,722 A | 1/1991 | Ushijima et al. |
| 5,202,716 A | 4/1993 | Tateyama et al. |
| 5,339,128 A | 8/1994 | Tateyama et al. |
| 5,442,416 A | 8/1995 | Tateyama et al. |
| 5,610,683 A | 3/1997 | Takahashi |
| 5,788,868 A | 8/1998 | Itaba et al. |
| 5,792,596 A | 8/1998 | Yasuzato et al. |
| 6,261,378 B1 | 7/2001 | Hashimoto et al. |
| 6,319,322 B1 | 11/2001 | Ueda et al. |
| 6,402,400 B1 | 6/2002 | Ueda et al. |
| 6,402,401 B1 | 6/2002 | Ueda et al. |
| 6,454,472 B1 | 9/2002 | Kim et al. |
| 6,471,422 B1 | 10/2002 | Ueda et al. |
| 6,511,315 B2 | 1/2003 | Hashimoto |
| 6,558,053 B2 | 5/2003 | Shigemori et al. |
| 6,585,430 B2 | 7/2003 | Matsuyama et al. |
| 6,672,779 B2 | 1/2004 | Ueda et al. |
| 6,824,621 B2 | 11/2004 | Shibagaki |
| 6,873,938 B1 | 3/2005 | Paxton et al. |
| 6,893,171 B2 | 5/2005 | Fukutomi et al. |
| 7,009,148 B2 | 3/2006 | Kawano et al. |
| 7,294,586 B2 | 11/2007 | Kawano et al. |
| 7,359,034 B2 | 4/2008 | Ishii |
| 7,364,376 B2 | 4/2008 | Sugimoto et al. |
| 7,364,626 B2 | 4/2008 | Hirose et al. |
| 7,385,674 B2 | 6/2008 | Ishii |
| 7,387,131 B2 | 6/2008 | Kuroda et al. |
| 7,497,633 B2 | 3/2009 | Kaneyama et al. |
| 7,524,771 B2 | 4/2009 | Izumi et al. |
| 7,604,424 B2 | 10/2009 | Shigemori et al. |
| 7,497,560 B2 | 2/2010 | Kaneyama et al. |
| 7,658,560 B2 | 2/2010 | Kaneyama |
| 7,665,916 B2 | 2/2010 | Yamamoto et al. |
| 8,034,190 B2 | 10/2011 | Yasuda et al. |
| 8,496,761 B2 | 7/2013 | Kaneyama et al. |
| 8,540,824 B2 | 9/2013 | Kaneyama et al. |
| 8,585,830 B2 | 11/2013 | Yasuda et al. |
| 2001/0018167 A1 | 8/2001 | Mutoh |
| 2001/0021486 A1 | 9/2001 | Kitano |
| 2001/0024767 A1 | 9/2001 | Toshima et al. |
| 2001/0044078 A1 | 11/2001 | Takahata et al. |
| 2002/0001679 A1 | 1/2002 | Matsuyama et al. |
| 2002/0029788 A1 | 3/2002 | Verhaverbeke et al. |
| 2002/0029852 A1 | 3/2002 | Egashira |
| 2002/0098458 A1 | 7/2002 | Hashimoto |
| 2002/0160625 A1 | 10/2002 | Inoue et al. |
| 2003/0036293 A1 | 2/2003 | Tanaka et al. |
| 2003/0045131 A1 | 3/2003 | Verbeke et al. |
| 2003/0086034 A1 | 3/2003 | Kitamoto et al. |
| 2003/0085195 A1 | 5/2003 | Lee et al. |
| 2003/0155069 A1 | 8/2003 | Lee et al. |
| 2003/0172955 A1 | 9/2003 | Kuroda et al. |
| 2003/0213431 A1 | 11/2003 | Fukutomi et al. |
| 2003/0226577 A1 | 12/2003 | Orll et al. |
| 2004/0005149 A1 | 1/2004 | Sugimoto et al. |
| 2004/0040177 A1 | 3/2004 | Izumi |
| 2004/0053170 A1 | 3/2004 | Ijima et al. |
| 2004/0060190 A1 | 4/2004 | Lee |
| 2004/0062861 A1 | 4/2004 | Sato |
| 2004/0087158 A1 | 5/2004 | Izumi et al. |
| 2004/0118814 A1 | 6/2004 | Kim et al. |
| 2004/0182318 A1 | 9/2004 | Hashinoki et al. |
| 2005/0027387 A1 | 2/2005 | Fujishima |
| 2005/0046934 A1 | 3/2005 | Ho et al. |
| 2005/0069819 A1 | 3/2005 | Shiobara |
| 2005/0075819 A1 | 4/2005 | Paxton et al. |
| 2005/0161644 A1 | 7/2005 | Zhang et al. |
| 2005/0176254 A1 | 8/2005 | Takeishi et al. |
| 2005/0221234 A1 | 10/2005 | Ito |
| 2005/0225738 A1 | 10/2005 | Shirai |
| 2005/0259232 A1 | 11/2005 | Streefkerk et al. |
| 2005/0287821 A1 | 12/2005 | Higashi et al. |
| 2006/0017903 A1 | 1/2006 | Bleeker et al. |
| 2006/0061747 A1 | 3/2006 | Ishii |
| 2006/0098978 A1 | 5/2006 | Yasuda et al. |
| 2006/0098979 A1 | 5/2006 | Kaneyama et al. |
| 2006/0103818 A1 | 5/2006 | Holmes et al. |
| 2006/0104635 A1 | 5/2006 | Kaneyama et al. |
| 2006/0141400 A1 | 6/2006 | Hirayama et al. |
| 2006/0147201 A1 | 7/2006 | Asano et al. |
| 2006/0147202 A1 | 7/2006 | Yasuda et al. |
| 2006/0152693 A1 | 7/2006 | Yasuda et al. |
| 2006/0152694 A1 | 7/2006 | Yasuda et al. |
| 2006/0152698 A1 | 7/2006 | Ishii |
| 2006/0159449 A1 | 7/2006 | Yasuda et al. |
| 2006/0164613 A1 | 7/2006 | Akimoto |
| 2006/0256316 A1 | 11/2006 | Tanno et al. |
| 2006/0291854 A1 | 12/2006 | Kaneyama et al. |
| 2007/0003278 A1 | 1/2007 | Kaneyama |
| 2007/0031755 A1 | 2/2007 | Hirayama et al. |
| 2007/0052942 A1 | 3/2007 | Tanno et al. |
| 2007/0071439 A1 | 3/2007 | Kaneyama et al. |
| 2007/0122551 A1 | 5/2007 | Yamamoto et al. |
| 2007/0134593 A1 | 6/2007 | Hirayama et al. |
| 2007/0177869 A1 | 8/2007 | Yamamoto et al. |
| 2007/0293974 A1 | 12/2007 | Kitamoto et al. |
| 2007/0294058 A1 | 12/2007 | Kitamoto et al. |
| 2008/0020315 A1 | 1/2008 | Higashi et al. |
| 2008/0064226 A1 | 3/2008 | Kawano et al. |
| 2009/0004607 A1 | 1/2009 | Shimoaoki et al. |
| 2009/0073394 A1 | 3/2009 | Miyagi et al. |
| 2010/0129526 A1 | 5/2010 | Yasuda et al. |
| 2010/0136257 A1 | 6/2010 | Yasuda et al. |
| 2010/0136492 A1 | 6/2010 | Yasuda et al. |
| 2010/0190116 A1 | 7/2010 | Kaneyama et al. |
| 2010/0239986 A1 | 9/2010 | Kaneyama et al. |

FOREIGN PATENT DOCUMENTS

| | | |
|---|---|---|
| CN | 1455438 A | 11/2003 |
| CN | 1926662 A | 3/2007 |
| EP | 0 605 103 A1 | 7/1994 |
| JP | 59-011628 A | 1/1984 |
| JP | 05-178416 A | 7/1993 |
| JP | 06-124873 A | 5/1994 |
| JP | 06-151293 A | 5/1994 |
| JP | 08-191046 A | 7/1996 |
| JP | 08-222513 A | 8/1996 |
| JP | 08-314156 A | 11/1996 |
| JP | 09-074126 A | 3/1997 |
| JP | 09-074127 A | 3/1997 |
| JP | 10-041261 A | 2/1998 |
| JP | 10-057872 A | 3/1998 |
| JP | 11-106042 A | 4/1999 |
| JP | 11-145246 A | 5/1999 |
| JP | 11-233480 A | 8/1999 |
| JP | 11-260686 A | 9/1999 |
| JP | 11-274265 A | 10/1999 |
| JP | 2000-252187 A | 9/2000 |
| JP | 2000-340544 A | 12/2000 |
| JP | 2001-203143 A | 7/2001 |
| JP | 2001-319856 A | 11/2001 |
| JP | 2002-086046 A | 3/2002 |
| JP | 2002-198347 A | 7/2002 |

(56) References Cited

FOREIGN PATENT DOCUMENTS

| | | |
|---|---|---|
| JP | 2002-217267 A | 8/2002 |
| JP | 2002-273360 A | 9/2002 |
| JP | 3337677 | 10/2002 |
| JP | 2003-007663 A | 1/2003 |
| JP | 2003-086479 A | 3/2003 |
| JP | 2003-092283 A | 3/2003 |
| JP | 2003-093943 A | 4/2003 |
| JP | 2003-205265 A | 7/2003 |
| JP | 2003-324139 A | 11/2003 |
| JP | 2004-015023 A | 1/2004 |
| JP | 2004-055766 A | 2/2004 |
| JP | 2004-087795 A | 3/2004 |
| JP | 2004-134674 A | 4/2004 |
| JP | 2004-193597 A | 7/2004 |
| JP | 2004-214587 A | 7/2004 |
| JP | 2004-228594 A | 8/2004 |
| JP | 2004-273894 A | 9/2004 |
| JP | 2004-274069 A | 9/2004 |
| JP | 2004-319767 A | 11/2004 |
| JP | 2004-342654 A | 12/2004 |
| JP | 2005-109146 A | 4/2005 |
| JP | 2005-197469 A | 7/2005 |
| JP | 2005-203563 A | 7/2005 |
| JP | 2005-294520 A | 10/2005 |
| JP | 2006-024684 A | 1/2006 |
| JP | 2006-049757 A | 2/2006 |
| JP | 2006-080403 A | 3/2006 |
| KR | 1999-0045297 A | 6/1999 |
| WO | WO 99/49504 A1 | 9/1999 |
| WO | WO 2004/053956 A | 6/2004 |
| WO | WO 2004-053959 A1 | 6/2004 |
| WO | WO 2004-074937 A1 | 9/2004 |
| WO | WO 2004/102646 A1 | 11/2004 |
| WO | WO 2005/015627 A1 | 2/2005 |
| WO | WO 2005/019937 A1 | 3/2005 |
| WO | WO 2005/036623 A | 4/2005 |
| WO | WO 2005-101467 A1 | 10/2005 |

OTHER PUBLICATIONS

Final Office Action for U.S. Appl. No. 12/698,862 mailed on Oct. 8, 2015, 24 pages.
Final Office Action for U.S. Appl. No. 12/698,876 mailed on Jul. 7, 2015, 9 pages.
Non-Final Office Action for U.S. Appl. No. 12/698,876 mailed on Nov. 16, 2015, 7 pages.
Final Office Action for U.S. Appl. No. 12/698,862 mailed on Oct. 24, 2014, 23 pages.
Non-Final Office Action for U.S. Appl. No. 12/698,876 mailed on Dec. 15, 2014, 6 pages.
Office Action of KR Application No. 2005-116311, mailed Oct. 28, 2006, 8 pages. (English Translation Included).
Office Action of Chinese Application No. 200510129567X, dated Mar. 28, 2008, 31 pages. [including English Translation].
Office Action of Chinese Application No. 200510120446.9, mailed Jul. 24, 2009, 6 pages.
Prior art citations of granted Chinese Application No. 200510129566.5, issued Jul. 29, 2009, 1 page.
Prior art citations of granted Chinese Application No. 2005-10129564.6 issued Sep. 2, 2009, 1 page.
Office Action of Japanese Application No. 2005-281600 mailed Nov. 24, 2009, 2 pages.
Office Action of Chinese Application No. 200510120446.9, mailed Apr. 2, 2010, 7 pages.
Prior art citations of granted Chinese Application No. 2005-10120440.1, issued Jun. 23, 2010, 1 page.
Office Action of Japanese Patent Application No. 2005-267330, mailed Jul. 6, 2010, 4 pages.
Office Action of Japanese Application No. 2005-216159 mailed Jul. 6, 2010, 2 pages.
Office Action of Japanese Application No. 2005-281600 mailed Jul. 13, 2010, 2 pages.
Office Action of Chinese Application No. 200510120446.9, mailed Aug. 12, 2010, 9 pages.
Office Action of Japanese Patent Application No. 2005-267330, mailed Jan. 18, 2011, 2 pages.
Office Action of Japanese Patent Application No. 2005-215159 mailed Jan. 18, 2011, 2 pages.
Office Action of Japanese Patent Application No. 2005-216158 mailed Jan. 18, 2011, 3 pages.
Office Action in the counterpart Japanese Application No. 2005-267331, dated Mar. 1, 2011, 3 pages.
Office Action in the counterpart Japanese Application No. 2005-267332, mailed Mar. 1, 2011, 3 pages.
Office Action in the counterpart Japanese Application No. 2005-267331 dated May 31, 2011, 3 pages.
Office Action of Japanese Patent Application No. 2005-267332 dated May 31, 2011, 3 pages.
Decision to Grant a Patent for the counterpart Japanese patent application No. 2005-267331 dated Dec. 4, 2012, 3 pages.
Non-Final Office Action for U.S. Appl. No. 12/754,872 mailed on Sep. 28, 2010, 20 pages.
Non-Final Office Action for U.S. Appl. No. 12/813,251 mailed on Oct. 18, 2010, 30 pages.
Non-Final Office Action for U.S. Appl. No. 12/719,788 mailed on Dec. 9, 2010, 18 pages.
Non-Final Office Action for U.S. Appl. No. 12/698,870 mailed on Feb. 14, 2011, 19 pages.
Final Office Action for U.S. Appl. No. 12/813,251 mailed on Mar. 11, 2011, 30 pages.
Final Office Action for U.S. Appl. No. 12/754,872 mailed on Mar. 17, 2011, 23 pages.
Final Office Action for U.S. Appl. No. 12/698,870 mailed on Jun. 2, 2011, 19 pages.
Notice of Allowance for U.S. Appl. No. 12/719,788 mailed on Jun. 6, 2011, 9 pages.
Non-Final Office Action for U.S. Appl. No. 12/813,251 mailed on Jul. 14, 2011, 30 pages.
Non-Final Office Action for U.S. Appl. No. 12/754,872 mailed on Jul. 28, 2011, 22 pages.
Non-Final Office Action for U.S. Appl. No. 12/698,876 mailed Aug. 19, 2011, 5 pages.
Non-Final Office Action for U.S. Appl. No. 12/698,870 mailed on Sep. 14, 2011, 29 pages.
Non-Final Office Action for U.S. Appl. No. 12/698,862 mailed on Oct. 6, 2011, 15 pages.
Notice of Allowance for U.S. Appl. No. 12/813,251 mailed on Oct. 26, 2011, 8 pages.
Notice of Allowance for U.S. Appl. No. 12/754,872 mailed on Nov. 16, 2011, 6 pages.
Final Office Action for U.S. Appl. No. 12/698,876 mailed Dec. 9, 2011, 6 pages.
Final Office Action for U.S. Appl. No. 12/698,870 mailed on Feb. 8, 2012, 31 pages.
Non-Final Office Action for U.S. Appl. No. 12/813,251 mailed on Feb. 14, 2012, 48 pages.
Non-Final Office Action for U.S. Appl. No. 12/754,872 mailed Feb. 22, 2012, 38 pages.
Final Office Action for U.S. Appl. No. 12/698,862 mailed Mar. 13, 2012, 15 pages.
Non-Final Office Action for U.S. Appl. No. 12/698,870 mailed May 24, 2012, 36 pages.
Final Office Action for U.S. Appl. No. 12/813,251 mailed Jun. 4, 2012, 64 pages.
Non-Final Office Action for U.S. Appl. No. 12/698,862 mailed Jul. 20, 2012, 16 pages.
Final Office Action for U.S. Appl. No. 12/754,872 mailed Jul. 23, 2012, 41 pages.
Non-Final Office Action for U.S. Appl. No. 12/813,251 mailed on Oct. 17, 2012, 71 pages.
Non-Final Office Action for U.S. Appl. No. 12/698,870 mailed on Oct. 29, 2012, 27 pages.

(56) References Cited

OTHER PUBLICATIONS

Non-Final Office Action for U.S. Appl. No. 12/754,872 mailed on Oct. 29, 2012, 25 pages.
Final Office Action for U.S. Appl. No. 12/698,862 mailed on Feb. 20, 2013, 18 pages.
Non-Final Office Action for U.S. Appl. No. 12/698,870 mailed on Mar. 6, 2013, 41 pages.
Notice of Allowance for U.S. Appl. No. 12/754,872 mailed on Mar. 12, 2013, 12 pages.
Non-Final Office Action for U.S. Appl. No. 12/698,862 mailed on Jun. 21, 2013, 19 pages.
Non-Final Office Action for U.S. Appl. No. 12/698,876 mailed on Jun. 26, 2013, 7 pages.
Notice of Allowance for U.S. Appl. No. 12/698,870 mailed on Jul. 10, 2013, 12 pages.
Final Office Action for U.S. Appl. No. 12/698,876 mailed on Oct. 7, 2013, 6 pages.
Final Office Action for U.S. Appl. No. 12/698,862 mailed on Oct. 30, 2013, 19 pages.
Non-Final Office Action for U.S. Appl. No. 12/698,862 mailed on Mar. 21, 2014, 19 pages.
Non-Final Office Action for U.S. Appl. No. 12/698,876 mailed on Mar. 20, 2014, 7 pages.
Non-Final Office Action for U.S. Appl. No. 12/698,862 mailed on Mar. 17, 2016, 24 pages.
Final Office Action for U.S. Appl. No. 12/698,876 mailed on Jun. 2, 2016, 6 pages.
Final Office Action for U.S. Appl. No. 12/698,862 mailed on Sep. 19, 2016, 21 pages.
Non-Final Office Action for U.S. Appl. No. 12/698,876 mailed on Sep. 26, 2016, 12 pages.

SUBSTRATE PROCESSING APPARATUS

CROSS-REFERENCES TO RELATED APPLICATIONS

This application is a division of U.S. patent application Ser. No. 12/698,862, filed Feb. 2, 2010, now abandoned, which is a division of U.S. patent application Ser. No. 11/295,216, filed Dec. 6, 2005, now abandoned, which claims priority to Japanese Patent Application No. 2004-353120, filed Dec. 6, 2004, Japanese Patent Application 2005-095783, filed Mar. 29, 2005, and Japanese Patent Application No. 2005-267331, filed on Sep. 14, 2005. The disclosures of Ser. No. 11/295,216, JP 2004-353120, 2005-095783, and JP 2005-267331 are hereby incorporated by reference in their entirety for all purposes.

The present application is related to the following four applications filed Dec. 6, 2005, and commonly owned: 1) U.S. patent application Ser. No. 11/294,877, entitled "SUBSTRATE PROCESSING APPARATUS AND SUBSTRATE PROCESSING METHOD," 2) U.S. patent application Ser. No. 11/295,257, entitled "SUBSTRATE PROCESSING APPARATUS," 3) U.S. patent application Ser. No. 11/294,727, entitled "SUBSTRATE PROCESSING APPARATUS," and 4) U.S. patent application Ser. No. 11/295,240, entitled "SUBSTRATE PROCESSING APPARATUS AND SUBSTRATE PROCESSING METHOD."

BACKGROUND OF THE INVENTION

1. Field of the Invention

The present invention relates to substrate processing apparatuses for applying processing to substrates.

2. Description of the Background Art

A substrate processing apparatus is used to apply a variety of processing to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processing to a single substrate. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then carried to the exposure device through the interface block. After exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a surface of the substrate. This allows for a finer exposure pattern.

However, in the projection exposure device according to the aforementioned WO99/49504 pamphlet, exposure processing is performed with the substrate and the liquid being in contact with each other. Accordingly, part of the component of a resist applied on the substrate is eluted in the liquid. The resist component eluted in the liquid remains on a surface of the substrate, which may become the cause of a defect.

The resist component eluted in the liquid contaminates the lens of the exposure device. This may cause a defective dimension and a defective shape of the exposure pattern.

SUMMARY OF THE INVENTION

It is an object of the invention to provide a substrate processing apparatus capable of preventing a component of a photosensitive material on a substrate from being eluted in a liquid in an exposure device.

(1) A substrate processing apparatus according to one aspect of the invention that is arranged adjacent to an exposure device comprises a processing section for applying processing to a substrate, and an interface that is provided on one end of the processing section for exchanging the substrate between the processing section and the exposure device, wherein the processing section includes a first processing block that includes a first processing unit that forms a photosensitive film made of photosensitive material, a first thermal processing unit that thermally treats the substrate, and a first transport unit that transports the substrate, a second processing block that includes a second processing unit that applies a development processing to the substrate after the exposure processing by the exposure device, a second thermal processing unit that thermally treats the substrate, and a second transport unit that transports the substrate, and a third processing block that includes a third processing unit that washes the substrate after the formation of the photosensitive film by the first processing unit and before the exposure processing by the exposure device, and a third transport unit that transports the substrate.

In the substrate processing apparatus, a photosensitive film made of a photosensitive material is formed on the substrate by the first processing unit in the first processing block. Then, the substrate is transported to the first thermal processing unit by the first transport unit, where the substrate is subjected to given thermal treatment. The substrate is subsequently transported to an adjacent other processing block by the first transport unit.

Next, in the third processing block, the substrate is subjected to the washing processing by the third processing unit. Then, the substrate is transported to the exposure device from the processing section through the interface, where the substrate is subjected to exposure processing. The substrate after the exposure processing is subsequently transported to the processing section from the exposure device through the interface.

After that, in the second processing block, the substrate is subjected to development processing in the second processing unit. Then, the substrate is transported to the second thermal processing unit by the second transport unit, where the substrate is subjected to given thermal treatment. The substrate is subsequently transported to an adjacent other processing block by the second transport unit.

In this way, the substrate is subjected to washing processing by the third processing unit in the third processing block before the exposure processing by the exposure device. Part of the component of the photosensitive film formed on the substrate by the first processing unit is thus eluted, and washed away. In this case, even if the substrate in contact with a liquid is subjected to the exposure processing by the exposure device, the component of the photosensitive material on the substrate is hardly eluted. This reduces contamination in the exposure device while preventing the component of the photosensitive material from remaining on a surface of the substrate. As a result, processing defects of the substrate that may be generated in the exposure device can be reduced.

In addition, the substrate processing apparatus has the structure in which the third processing block is added to the existing substrate processing apparatus having the first and second processing blocks. This results in reduced processing defects of the substrate that may be generated in the exposure device.

(2) The third processing block may further include a third thermal processing unit that thermally treats the substrate, and is arranged adjacent to the interface. In this case, the washing processing can be applied to the substrate by the third processing unit immediately before the exposure processing by the exposure device. This enables the transport route for the substrate after the washing processing to the exposure device to be shortened. This prevents the attachment of particles and the like in the atmosphere to the substrate in the transport process after the washing processing.

In addition, the substrate is subjected to a post-exposure bake (PEB) by the third thermal processing unit immediately after the exposure processing, and then the development processing can be applied to the substrate in the second processing block subsequently. This makes it possible to smoothly apply the post-exposure bake and the development processing to the substrate.

(3) The processing section further comprises a fourth processing block that includes a fourth processing unit that forms an anti-reflection film on the substrate before the formation of the photosensitive film by the first processing unit, a fourth thermal processing unit that thermally treats the substrate, and a fourth transport unit that transports the substrate. In this case, the anti-reflection film is formed on the substrate by the fourth processing unit, which prevents the potential standing wave and halation during the exposure processing. Therefore, the generation of the processing defects of the substrate during the exposure processing can be sufficiently reduced.

(4) The substrate processing apparatus may further comprise an indexer that is arranged adjacent to another end of the processing section and carries in the substrate to the processing section and carries out the substrate from the processing section, wherein the fourth processing block is arranged adjacent to the indexer. In this case, the anti-reflection film is formed in the fourth processing block immediately after the transporting of the substrate to the processing section, and then the photosensitive film can be formed in the first processing block subsequently. This enables the formations of the anti-reflection film and the photosensitive film on the substrate smoothly.

(5) The interface may include a fifth processing unit that applies given processing to the substrate, a platform on which the substrate is temporarily mounted, a fifth transport unit that transports the substrate between the processing section, the fifth processing unit, and the platform, and a sixth transport unit that transports the substrate between the platform and the exposure device.

In this case, the substrate is transported to the fifth processing unit from the processing section by the fifth transport unit. The substrate is subjected to the given processing by the fifth processing unit, and then transported to the platform by the fifth transport unit. After this, the substrate is transported to the exposure device from the platform by the sixth transport unit. The substrate is subjected to the exposure processing by the exposure device, and then transported to the platform from the exposure device by the sixth transport unit. After this, the substrate is transported to the processing section from the platform by the fifth transport unit.

In this way, the disposition of the fifth processing unit in the interface and the transport of the substrate by the two transport units enables the addition of processing contents without increasing the footprint of the substrate processing apparatus.

(6) The fifth transport unit may include first and second holders for holding the substrate, the fifth transport unit may hold the substrate with the first holder during the transport of the substrate before the exposure processing by the exposure device, and may hold the substrate with the second holder during the transport of the substrate after the exposure processing by the exposure device, the sixth transport unit may include third and fourth holders for holding the substrate, and the sixth transport unit may hold the substrate with the third holder during the transport of the substrate before the exposure processing by the exposure device, and may hold the substrate with the fourth holder during the transport of the substrate after the exposure processing by the exposure device.

In this case, the first and third holders are used during the transport of the substrate to which no liquid is attached before the exposure processing, while the second and fourth holders are used during the transport of the substrate to which a liquid is attached after the exposure processing. This prevents a liquid from attaching to the first and third holders, which prevents the attachment of a liquid to the substrate before the exposure processing. This makes it possible to prevent contamination of the substrate due to the attachment of particles and the like in the atmosphere. As a result, it is possible to prevent contamination in the exposure device, so that the processing defects of the substrate that may be generated in the exposure device can be reduced.

(7) The second holder may be provided below the first holder, and the fourth holder may be provided below the third holder. This prevents a liquid that drops from the second and fourth holders and substrates held thereon from attaching to the first and third holders and substrates held thereon. This reliably prevents a liquid from attaching to the substrate before the exposure processing.

(8) The fifth processing unit may include an edge exposure unit that subjects a peripheral portion of the substrate to exposure. In this case, the peripheral portion of the substrate is subjected to the exposure processing by the edge exposure unit.

(9) The third processing unit may further dry the substrate after washing the substrate.

This prevents the attachment of particles and the like in the atmosphere to the washed substrate. Also, if the washing liquid remains on the washed substrate, the component of the photosensitive material may be eluted in the residual washing liquid. Thus, by drying the washed substrate, it is possible to prevent the component of the film on the substrate from being eluted in the washing liquid remaining on the substrate. It is therefore possible to reliably prevent a defective shape of the photosensitive film formed on the substrate and the contamination inside the exposure device. As a result of the foregoing, processing defects of the substrate are reliably prevented.

(10) The third processing unit may comprise a substrate holding device that holds the substrate substantially horizontally, a rotation-driving device that rotates the substrate held on the substrate holding device about an axis vertical to the substrate, a washing liquid supplier that supplies a washing liquid onto the substrate held on the substrate holding device, and an inert gas supplier that supplies an inert gas onto the substrate after the washing liquid has been supplied onto the substrate by the washing liquid supplier.

In the third processing unit, the substrate is held on the substrate holding device substantially horizontally, and the substrate is rotated about the axis vertical to the substrate by the rotation-driving device. Then, the washing liquid is supplied onto the substrate from the washing liquid supplier, followed by the supply of the inert gas from the inert gas supplier.

In this case, since the substrate is rotated as the washing liquid is supplied onto the substrate, the washing liquid on the substrate moves toward the peripheral portion of the substrate by the centrifugal force and splashed away. This prevents the component of the photosensitive material eluted in the washing liquid from remaining on the substrate. In addition, since the substrate is rotated as the inert gas is supplied onto the substrate, the washing liquid remaining on the substrate after the washing of the substrate is efficiently removed. This reliably prevents the deposits of particles and the like from remaining on the substrate and the substrate is reliably dried. Therefore, during the transport of the washed substrate to the exposure device, it is possible to reliably prevent the component of photosensitive material on the substrate from being further eluted in the washing liquid remaining on the substrate. As a result of the foregoing, it is possible to reliably prevent a defective shape of the photosensitive film formed on the substrate and the contamination inside the exposure device.

(11) The inert gas supplier may supply the inert gas so that the washing liquid supplied onto the substrate from the washing liquid supplier is removed from the substrate as the washing liquid moves outwardly from the center of the substrate.

This prevents the washing liquid from remaining on the center of the substrate, thus reliably preventing the generation of dry marks (dry stains) on a surface of the substrate. In addition, during the transport of the washed substrate to the exposure device, it is possible to reliably prevent the component of photosensitive material on the substrate from being further eluted in the washing liquid remaining on the substrate. As a result of the foregoing, processing defects of the substrate are more reliably prevented.

(12) The third processing unit may further comprise a rinse liquid supplier that supplies a rinse liquid onto the substrate after the supply of the washing liquid from the washing liquid supplier and before the supply of the inert gas from the inert gas supplier.

This allows the washing liquid to be reliably washed away by the rinse liquid, making it possible to prevent the component of the photosensitive material eluted in the washing liquid from remaining on the substrate more reliably.

(13) The inert gas supplier may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, which prevents the generation of dry marks on the surface of the substrate reliably. Also, during the transport of the washed substrate to the exposure device, it is possible to reliably prevent the component of photosensitive material on the substrate from being further eluted in the rinse liquid remaining on the substrate. As a result of the foregoing, it is possible to prevent processing defects of the substrate more reliably.

(14) The third processing unit may wash the substrate by supplying a fluid mixture containing a washing liquid and a gas onto the substrate from a fluid nozzle.

Since the fluid mixture discharged from the fluid nozzle contains fine droplets, any contaminants attached on the surface of the substrate are stripped off, even if the surface has irregularities. Moreover, even if the film on the substrate has low wettability, the fine droplets strip off the contaminants on the substrate surface.

Consequently, even if the solvent or the like in the film on the substrate is sublimated and the sublimates are attached to the substrate again before the exposure processing, the sublimates attached to the substrate can be reliably removed by the third processing unit. It is therefore possible to reliably prevent the contamination inside the exposure device. As a result of the foregoing, processing defects of the substrate can be reliably reduced.

In addition, adjusting the flow rate of the gas allows adjustments to be easily made to the detergency in washing the substrate. Thus, when the film on the substrate is prone to damage, damage to the film on the substrate can be prevented by weakening the detergency. Tough contaminants on the substrate surface can also be removed reliably by strengthening the detergency. By adjusting the detergency in this way according to the properties of the film on the substrate and the degree of contamination, it is possible to prevent damage to the film on the substrate and wash the substrate reliably.

(15) The gas may be an inert gas. In this case, it is possible to prevent a chemical influence upon the film on the substrate and the washing liquid while removing the contaminants on the substrate surface more reliably, even if a chemical solution is used as washing liquid.

(16) The third processing unit may further dry the substrate after washing the substrate.

This prevents the attachment of particles and the like in the atmosphere to the washed substrate. Also, if the washing liquid remains on the washed substrate, the component of the film formed on the substrate may be eluted in the residual washing liquid. Thus, by drying the washed substrate, it is possible to prevent the component of the film on the substrate from being eluted in the washing liquid remaining on the substrate. It is therefore possible to reliably prevent a defective shape of the photosensitive film formed on the substrate and the contamination inside the exposure device. As a result of the foregoing, processing defects of the substrate are reliably prevented.

(17) The third processing unit may include an inert gas supplier that dries the substrate by supplying an inert gas onto the substrate. The use of the inert gas prevents a chemical influence upon the film on the substrate and the substrate is reliably dried.

(18) The fluid nozzle may function as the inert gas supplier. In this case, the inert gas is supplied onto the substrate from the fluid nozzle to apply drying processing to the substrate. This obviates the need to provide the inert gas supplier separately from the fluid nozzle. As a result, the washing and drying processing can be reliably applied to the substrate with a simple structure.

(19) The third processing unit may further includes a substrate holding device that holds the substrate substantially horizontally, and a rotation-driving device that rotates the substrate held on the substrate holding device about an axis vertical to the substrate.

In the third processing unit, the substrate is held on the substrate holding device substantially horizontally, and the substrate is rotated about the axis vertical to the substrate by the rotation-driving device. Further, the fluid mixture is supplied onto the substrate from the fluid nozzle, followed by the supply of the inert gas from the inert gas supplier.

In this case, since the substrate is rotated as the fluid mixture is supplied onto the substrate, the fluid mixture on the substrate moves toward the peripheral portion of the substrate by the centrifugal force and splashed away. This reliably prevents the deposits of particles and the like removed by the fluid mixture from remaining on the substrate. In addition, since the substrate is rotated as the inert gas is supplied onto the substrate, the fluid mixture remaining on the substrate after the washing of the substrate is efficiently removed. This reliably prevents the deposits of particles and the like from remaining on the substrate and the substrate dried reliably. As a result, processing defects of the substrate are prevented reliably.

(20) The third processing unit may supply the inert gas so that the fluid mixture supplied onto the substrate from the fluid nozzle is removed from the substrate as the fluid mixture moves outwardly from the center of the substrate.

This prevents the fluid mixture from remaining on the center of the substrate, thus reliably preventing the generation of dry marks on a surface of the substrate. Accordingly, processing defects of the substrate are prevented reliably.

(21) The third processing unit may further include a rinse liquid supplier that supplies a rinse liquid onto the substrate, after the supply of the fluid mixture from the fluid nozzle and before the supply of the inert gas from the inert gas supplier.

This allows the fluid mixture to be reliably washed away by the rinse liquid, thus reliably preventing the deposits of particles and the like from remaining on the substrate.

(22) The fluid nozzle may function as the rinse liquid supplier. In this case, the rinse liquid is supplied from the fluid nozzle. This obviates the need to provide the rinse liquid supplier separately from the fluid nozzle. As a result, the washing and drying processing can be reliably applied to the substrate with a simple structure.

(23) The third processing unit may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Accordingly, processing defects of the substrate are prevented reliably.

(24) The fluid nozzle may have a liquid flow passage through which a liquid flows, a gas flow passage through which a gas flows, a liquid discharge port having an opening that communicates with the liquid flow passage, and a gas discharge port that is provided near the liquid discharge port and has an opening that communicates with the gas flow passage.

In this case, the washing liquid flows through the liquid flow passage, and is discharged from the liquid discharge port, while the gas flows through the gas flow passage, and is discharged from the gas discharge port. The washing liquid and gas are mixed outside the fluid nozzle. A mist-like fluid mixture is thus generated.

In this way, the fluid mixture is generated by mixing the washing liquid and the gas outside the fluid nozzle. This obviates the need to provide space for mixing the washing liquid and the gas inside the fluid nozzle. As a result, the size of the fluid nozzle can be reduced.

According to the invention, the substrate is washed in the third processing block before the exposure processing by the exposure device. In this case, even if the substrate in contact with a liquid is subjected to the exposure processing by the exposure device, the component of the photosensitive material on the substrate is hardly eluted. This prevents contamination inside the exposure device while preventing the component of the photosensitive material from remaining on a surface of the substrate. As a result, processing defects of the substrate that may be generated in the exposure device can be reduced.

The foregoing and other objects, features, aspects and advantages of the present invention will become more apparent from the following detailed description of the present invention when taken in conjunction with the accompanying drawings.

DETAILED DESCRIPTION OF SPECIFIC EMBODIMENTS

A substrate processing apparatus according to an embodiment of the invention will be described with reference to the drawings. A substrate as used in the specification includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

Figure 1:
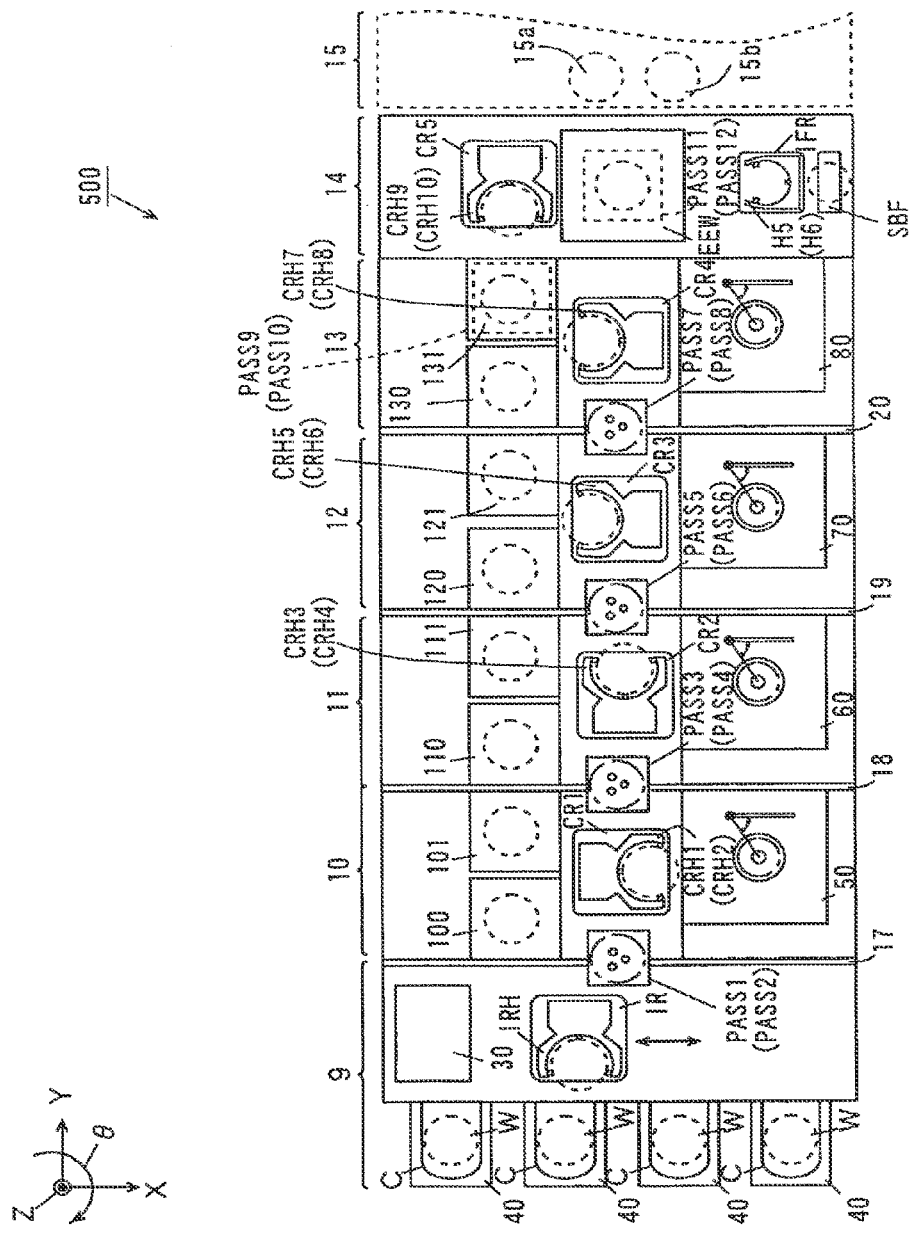
FIG. 1 is a plan view of a substrate processing apparatus according to a first embodiment of the invention.

FIG. 1 is a plan view of the semiconductor laser apparatus according to the embodiment of the invention.

Each of FIG. 1 and the subsequent drawings is accompanied by the arrows that indicate X, Y, and Z directions perpendicular to one another for clarification of positions. The X and Y directions are perpendicular to each other in a horizontal plane, and the Z direction corresponds to the vertical direction. In each of the directions, the direction toward an arrow is defined as +direction, and the opposite direction is defined as −direction. The rotation direction about the Z direction is defined as θ direction.

As shown in FIG. 1, the substrate processing apparatus 500 includes an indexer block 9, an anti-reflection film processing block 10, a resist film processing block 11, a development processing block 12, a washing processing block 13, and an interface block 14. An exposure device 15 is arranged adjacent to the interface block 14. The exposure device 15 applies exposure processing to substrates W by a liquid immersion method.

Each of the indexer block 9, the anti-reflection film processing block 10, the resist film processing block 11, the development processing block 12, the washing processing block 13, and the interface block 14 will hereinafter be referred to as a processing block.

The indexer block 9 includes a main controller (controller) 30 for controlling the operation of each processing block, a plurality of carrier platforms 40, and an indexer robot IR. The indexer robot IR has a hand IRH for receiving and transferring the substrates W.

The anti-reflection film processing block 10 includes thermal processing groups 100, 101 for anti-reflection film, a coating processing group 50 for anti-reflection film, and a first central robot CR1. The coating processing group 50 is arranged opposite to the thermal processing groups 100, 101 with the first central robot CR1 therebetween. The first central robot CR1 has hands CRH1, CRH2 provided one above the other for receiving and transferring the substrates W.

A partition wall 17 is arranged between the indexer block 9 and the anti-reflection film processing block 10 for shielding an atmosphere. The partition wall 17 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS1, PASS2 has an optical sensor (not shown) for detecting the presence or absence of a substrate W. This enables a determination to be made whether or not a substrate W is on the substrate platform PASS1, PASS2. In addition, each of the substrate platforms PASS1, PASS2 has a plurality of support pins secured thereto. Note that each of substrate platforms PASS3 to PASS12 mentioned below similarly has such an optical sensor and support pins.

The resist film processing block 11 includes thermal processing groups 110, 111 for resist film, a coating processing group 60 for resist film, and a second central robot CR2. The coating processing group 60 is arranged opposite to the thermal processing groups 110, 111 with the second central robot CR2 therebetween. The second central robot CR2 has hands CRH3, CRH4 provided one above the other for receiving and transferring the substrates W.

A partition wall 18 is arranged between the anti-reflection film processing block 10 and the resist film processing block 11 for shielding an atmosphere. The partition wall 18 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The development processing block 12 includes thermal processing groups 120, 121 for development, a development processing group 70, and a third central robot CR3. The development processing group 70 is arranged opposite to the thermal processing groups 120, 121 with the third central robot therebetween. The third central robot CR3 has hands CRH5, CRH6 provided one above the other for receiving and transferring the substrates W.

A partition wall 19 is arranged between the resist film processing block 11 and the development processing block 12 for shielding an atmosphere. The partition wall 19 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The washing processing block 13 includes thermal processing groups 130, 131 for post-exposure bake (PEB), a washing processing group 80, and a fourth central robot CR4. The thermal processing group 131, adjacent to the interface block 14, comprises the substrate platforms PASS9, PASS10 as described below. The washing processing group 80 is arranged opposite to the thermal processing groups 130, 131 with the fourth central robot CR4 therebetween. The fourth central robot CR4 has hands CRH7, CRH8 provided one above the other for receiving and transferring the substrates W.

A partition wall 20 is arranged between the development processing block 12 and the washing processing block 13 for shielding an atmosphere. The partition wall 20 has substrate platforms PASS7, PASS8 provided closely one above the other for receiving and transferring the substrates W between the development processing block 12 and the washing processing block 13. The upper substrate platform PASS7 is used in transferring the substrates W from the development processing block 12 to the washing processing block 13, and the lower substrate platform PASS8 is used in transferring the substrates W from the washing processing block 13 to the development processing block 12.

The interface block 14 includes a fifth central robot CR5, a buffer unit SBF, an interface transport mechanism IFR, and edge exposure units EEW. Return buffer units RBF and substrate platforms PASS11, PASS12 mentioned below are provided under the edge exposure units EEW. The fifth central robot CR5 has hands CRH9, CRH10 provided one above the other for receiving and transferring the substrates W, and the interface transport mechanism IFR has hands CRH5, CRH6 provided one above the other for receiving and transferring the substrates W In the substrate processing apparatus 500 according to this embodiment, the indexer block 9, the anti-reflection film processing block 10, the resist film processing block 11, the development processing block 12, the washing processing block 13, and the interface block 14 are sequentially arranged in parallel along the Y direction.

Figure 2:
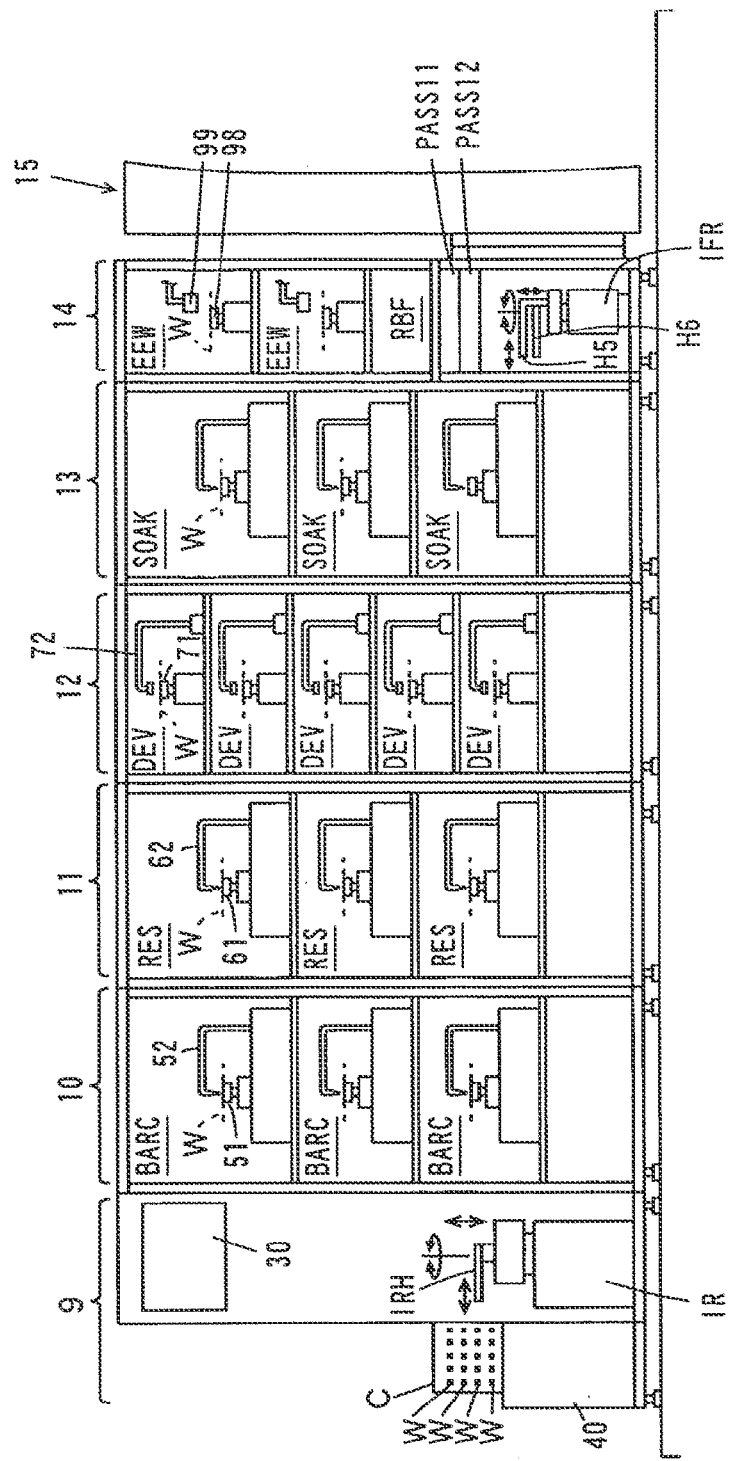
FIG. 2 is a side view of the substrate processing apparatus in FIG. 1 that is seen from the +X direction.

FIG. 2 is a side view of the substrate processing apparatus 500 in FIG. 1 that is seen from the +X direction.

The coating processing group 50 in the anti-reflection film processing block 10 (see FIG. 1) includes a vertical stack of three coating units BARC. Each of the coating units BARC comprises a spin chuck 51 for rotating a substrate W while holding the substrate W in a horizontal attitude by suction, and a supply nozzle 52 for supplying coating liquid for anti-reflection film to the substrate W held on the spin chuck 51.

The coating processing group 60 in the anti-reflection film processing block 11 (see FIG. 1) includes a vertical stack of three coating units RES. Each of the coating units RES comprises a spin chuck 61 for rotating a substrate W while holding the substrate W in a horizontal attitude by suction, and a supply nozzle 62 for supplying coating liquid for anti-reflection film to the substrate W held on the spin chuck 61.

The development processing group 70 in the development processing block 12 (see FIG. 1) includes a vertical stack of five development processing units DEV. Each of the development processing units DEV comprises a spin chuck 71 for rotating a substrate W while holding the substrate W in a horizontal attitude by suction, and a supply nozzle 72 for supplying development liquid to the substrate W held on the spin chuck 71.

The washing processing group 80 in the washing processing block 13 (see FIG. 1) includes a vertical stack of three washing processing units SOAK. Each of the washing processing units SOAK applies washing and drying processing to a substrate W. The washing processing units SOAK will be described in detail below.

The interface block 14 includes a vertical stack of the two edge exposure units EEW, return buffer unit RBF, substrate platforms PASS11, PASS12, and also includes the fifth central robot CR5 (see FIG. 1) and interface transport mechanism IFR. Each of the edge exposure units EEW comprises a spin chuck 98 for rotating a substrate W while holding the substrate W in a horizontal attitude by suction, and a light irradiator 99 for subjecting a peripheral edge of the substrate W held on the spin chuck 98 to exposure.

Figure 3:
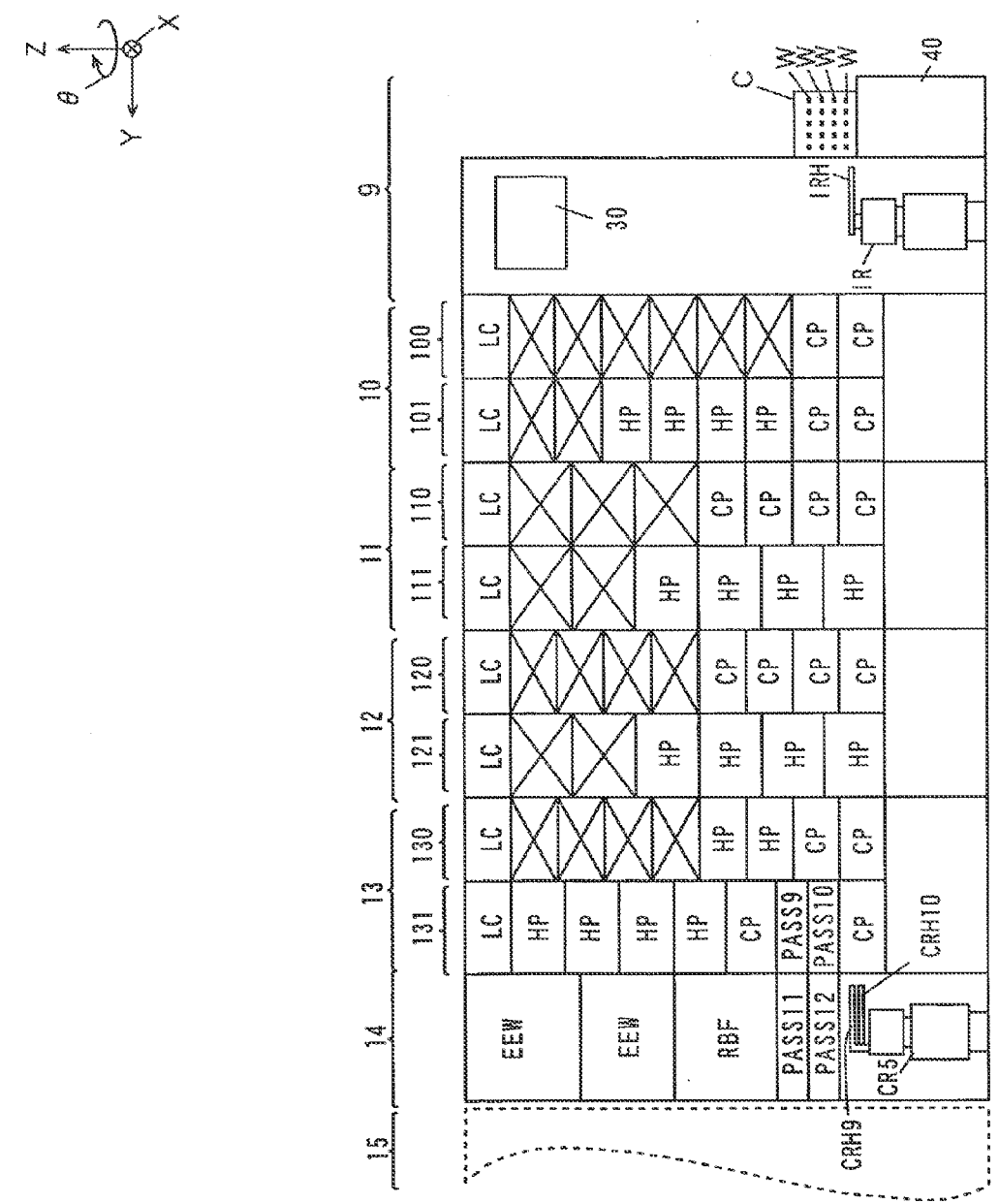
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the anti-reflection film processing block 10, the thermal processing group 100 includes a vertical stack of two cooling units (cooling plates) CP, and the thermal processing unit 101 includes a vertical stack of four heating units (hot plates) HP and two cooling units CP. The thermal processing group 100 also includes a local controller LC on top thereof for controlling the temperatures of the cooling units CP, and the thermal processing group 101 also includes a local controller LC on top thereof for controlling the temperatures of the heating units HP and the cooling units CP.

In the resist film processing block 11, the thermal processing group 110 includes a vertical stack of four cooling units CP, and the thermal processing group 111 includes a vertical stack of four heating units HP. The thermal processing group 110 also includes a local controller LC on top thereof for controlling the temperatures of the cooling units CP, and the thermal processing group 111 also includes a local controller LC on top thereof for controlling the temperatures of the heating units HP.

In the washing processing block 13, the thermal processing group 130 includes a vertical stack of two heating units HP and two cooling units CP, and the thermal processing group 131 includes a vertical stack of four heating units HP, a cooling unit CP, the substrate platforms PASS9, PASS10, and a cooling unit CP. The thermal processing group 130 also includes a local controller LC on top thereof for controlling the temperatures of the heating units HP and the cooling units CP, and the thermal processing group 131 also includes a local controller LC on top thereof for controlling the temperatures of the heating units HP and the cooling units CP.

Next, the operation of the substrate processing apparatus 500 in this embodiment will be described.

Carriers C for storing the substrates W in multiple stages are mounted on the carrier platforms 40, respectively, in the indexer block 9. The indexer robot IR takes out a substrate W yet to be processed which is stored in a carrier C using the hand IRH for receiving and transferring the substrates W. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the fifth central robot CR5, and the interface transport mechanism IFR, multi joint type transport robots that linearly move their hands forward and backward by moving their joints may also be used.

The unprocessed substrate W that has been transferred onto the substrate platform PASS1 is received by the first central robot CR1 in the anti-reflection film processing block 10. The first central robot CR1 carries the substrate W into the thermal processing group 100 or 101. After this, the first central robot CR1 takes out the thermally treated substrate W from the thermal processing group 100 or 101, and then carries the substrate W into the coating processing group 50. The coating processing group 50 forms a coating of an anti-reflection film over a lower portion of a photoresist film using a coating unit BARC, in order to reduce a standing wave and halation that may be generated during exposure.

The first central robot CR1 subsequently takes out the substrate W after the coating processing from the coating processing group 50, and carries the substrate W into the thermal processing group 100 or 101. Then, the first central robot CR1 takes out the thermally treated substrate W from the thermal processing group 100 or 101, and transfers the substrate W onto the substrate platform PASS3.

The substrate W on the substrate platform PASS3 is received by the second central robot CR2 in the resist film processing block 11. The second central robot CR2 carries the substrate W into the thermal processing group 110 or 111. The second central robot CR2 then takes out the thermally treated substrate W from the thermal processing group 110 or 111, and carries the substrate W into the coating processing group 60. In the coating processing group 60, a coating unit RES forms a coating of a resist film over the substrate W that is coated with the anti-reflection film.

After this, the second central robot CR2 takes out the substrate W after the coating processing from the coating processing group 60, and carries the substrate W into the thermal processing group 110 or 111. Then, the second central robot CR2 takes out the thermally treated substrate W from the thermal processing group 110 or 111, and transfers the substrate W onto the substrate platform PASS5.

The substrate W on the substrate platform PASS5 is received by the third central robot CR3 in the development processing block 12. The third central robot CR3 transfers the substrate W onto the substrate platform PASS7.

The substrate W on the substrate platform PASS7 is received by the fourth central robot CR4 in the washing processing block 13. The fourth central robot CR4 carries the substrate W into the washing processing group 80. As described above, in the washing processing group 80, the substrate W is subjected to the washing and drying processing by the washing processing unit SOAK.

The fourth central robot CR4 then takes out the substrate W after the washing processing from the washing processing unit 80, and transfers the substrate W to the substrate platform PASS9. The substrate W on the substrate platform PASS9 is received by the upper hand CRH9 of the fifth central robot CR5 in the interface block 14. The fifth central robot CR5 carries the substrate W into an edge exposure unit EEW with the hand CRH9. The edge exposure unit EEW subjects the peripheral portion of the substrate W to exposure processing.

Next, the fifth central robot CR5 takes out the substrate W after the edge exposure processing from the edge exposure unit EEW with the hand CRH9. Then, the fifth central robot CR5 transfers the substrate W onto the substrate platform PASS11 with the hand CRH9.

The substrate W transferred onto the substrate platform PASS11 is carried into the exposure device 15 by the interface transport mechanism IFR. The substrate W is subjected to exposure processing by the exposure device 15, and then transferred onto the substrate platform PASS12 by the interface transport mechanism IFR. The interface transport mechanism IFR will be described in detail below.

The substrate W on the substrate platform PASS12 is received by the lower hand CRH10 of the fifth central robot CR5 in the interface block 14. The fifth central robot CR5 carries the substrate W into the thermal processing group 131 in the washing processing block 13 with the hand CRH10. The substrate W is subjected to a post-exposure bake (PEB) by the thermal processing group 131. In addition, the substrate W may also be subject to a post-exposure bake by the thermal processing group 130.

After this, the fifth central robot CR5 takes out the substrate W after the thermal processing from the thermal processing group 131, and transports the substrate W onto the substrate platform PASS10. The substrate W on the substrate platform PASS10 is received by the fourth central robot CR4 in the washing processing block 13. The fourth central robot CR4 transports the substrate W onto the substrate platform PASS8.

The substrate W on the substrate platform PASS8 is received by the third central robot CR3 in the development processing block 12. The third central robot CR3 carries the substrate W into the development processing group 70. The exposed substrate W is subjected to development processing by the development processing group 70. Then, the third central robot CR3 takes out the substrate W after the development processing from the development processing group 70, and carries the substrate W into the thermal processing groups 120, 121.

Then, the third central robot CR3 takes out the thermally treated substrate W from the thermal processing groups 120, 120, and transport the substrate W onto the substrate platform PASS6. The substrate W on the platform PASS6 is transferred onto substrate platform PASS4 by the second central robot CR2 in the processing block 11. The substrate W on the platform PASS4 is transferred onto substrate platform PASS2 by the first central robot CR2 in the processing block 10.

The substrate W on the substrate platform PASS2 is stored in a carrier C by the indexer robot IR in the indexer block 9. Each of the processing to the substrate W in the substrate processing apparatus 500 is thus completed.

If the development processing group 80 is temporarily not capable of applying development processing to the substrate W by, e.g., a failure, the substrate W may temporarily be stored in the return buffer RBF1 in the interface block 14 after the thermal treatment in the thermal processing group 131.

Now, the aforementioned washing processing units SOAK will be described in detail with reference to drawings.

Figure 4:
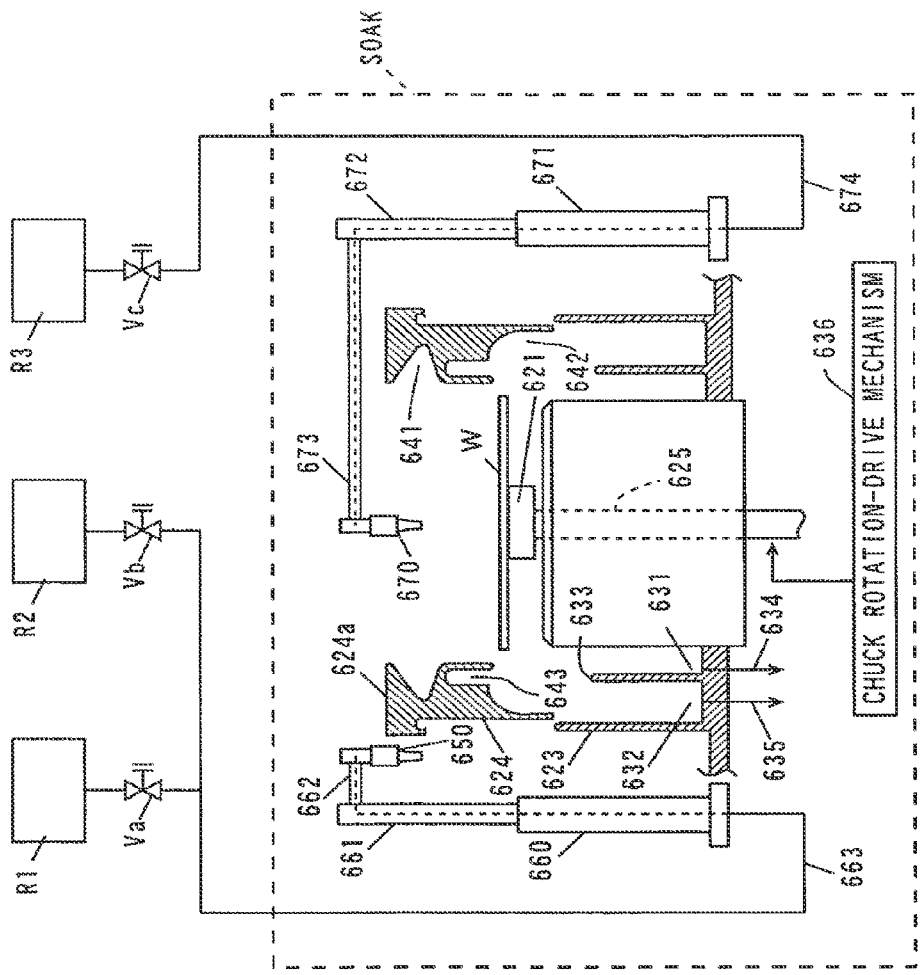
FIG. 4 is a diagram for use in illustrating the configuration of a washing processing unit.

The configuration of a washing processing unit SOAK is first described. FIG. 4 is a diagram for use in illustrating the configuration of the washing processing unit SOAK.

As shown in FIG. 4, the washing processing unit SOAK comprises a spin chuck 621 for rotating a substrate W about the vertical rotation axis passing through the center of the substrate W while horizontally holding the substrate W.

The spin chuck 621 is secured to an upper end of a rotation shaft 625, which is rotated via a chuck rotation-drive mechanism 636. An air suction passage (not shown) is formed in the spin chuck 621. With the substrate W being mounted on the spin chuck 621, air inside the air suction passage is discharged, so that a lower surface of the substrate W is sucked onto the spin chuck 621 by vacuum, and the substrate W can be held in a horizontal attitude.

A first rotation motor 660 is arranged outside the spin chuck 621. The first rotation motor 660 is connected to a first rotation shaft 661. The first rotation shaft 661 is coupled to a first arm 662, which extends in the horizontal direction, and whose end is provided with a nozzle 650 for washing processing.

The first rotation shaft 661 is rotated by the first rotation motor 660, so that the first arm 662 swings. This causes the nozzle 650 to move above the substrate W held on the spin chuck 621.

A supply pipe 663 for washing processing is arranged so as to pass through the inside of the first rotation motor 660, the first rotation shaft 661, and the first arm 662. The supply pipe 663 is connected to a washing liquid supply source R1 and a rinse liquid supply source R2 through a valve Va and a valve Vb, respectively. By controlling the opening and closing of the valves Va, Vb, it is possible to select a processing liquid supplied to the supply pipe 663 and adjust the amount of the processing liquid. In the configuration of FIG. 4, when the valve Va is opened, washing liquid is supplied to the supply pipe 663, and when the valve Vb is opened, rinse liquid is supplied to the supply pipe 663.

The washing liquid or the rinse liquid is supplied to the nozzle 650 through the supply pipe 663 from the washing liquid supply source R1 or the rinse liquid supply source R2. The washing liquid or the rinse liquid is thus supplied to a surface of the substrate W. Examples of the washing liquid may include pure water, a pure water solution containing a complex (ionized), or a fluorine-based chemical solution. Examples of the rinse liquid may include pure water, carbonated water, hydrogen water, electrolytic ionic water, and HFE (hydrofluoroether).

A second rotation motor 671 is arranged outside the spin chuck 621. The second rotation motor 671 is connected to a second rotation shaft 672. The second rotation shaft 672 is coupled to a second arm 673, which extends in the horizontal direction, and whose end is provided with a nozzle 670 for drying processing.

The second rotation shaft 672 is rotated by the second rotation motor 671, so that the second arm 673 swings. This causes the nozzle 670 to move above the substrate W held on the spin chuck 621.

A supply pipe 674 for drying processing is arranged so as to pass through the inside of the second rotation motor 671, the second rotation shaft 672, and the second arm 673. The supply pipe 674 is connected to an inert gas supply source R3 through a valve Vc. By controlling the opening and closing of the valve Vc, it is possible to adjust the amount of the inert gas supplied to the supply pipe 674.

The inert gas is supplied to the nozzle 670 through the supply pipe 674 from the inert gas supply source R3. The inert gas is thus supplied to the surface of the substrate W. Nitrogen gas ($N_2$), for example, may be used as the inert gas.

When supplying the washing liquid or the rinse liquid onto the surface of the substrate W, the nozzle 650 is positioned above the substrate. When supplying the inert gas onto the surface of the substrate W, the nozzle 650 is retracted to a predetermined position.

When supplying the washing liquid or the rinse liquid onto the surface of the substrate W, the nozzle 670 is retracted to a predetermined position. When supplying the inert gas onto the surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 is formed so as to surround the spin chuck 621 for discharging the processing liquid (i.e., washing liquid or rinse liquid) used in processing the substrate W. Also, a liquid recovery space 632 is formed between the processing cup 623 and the partition wall 633, so as to surround the discharge space 631, for recovering the processing liquid used in processing the substrate W.

The discharge space 631 is connected with a discharge pipe 634 for directing the processing liquid to a liquid discharge processing device (not shown), while the liquid recovery space 632 is connected with a recovery pipe 635 for directing the processing liquid to a recovery processing device (not shown).

A guard 624 is provided above the processing cup 623 for preventing the processing liquid on the substrate W from splashing outward. The guard 624 is configured to be rotation-symmetric with respect to the rotation shaft 625. An annular-shaped liquid discharge guide groove 641 with a V-shaped cross section is formed inwardly of an upper end portion of the guard 624.

Also, a liquid recovery guide 642 having an inclined surface that inclines down outwardly is formed inwardly of a lower portion of the guard 624. A partition wall housing groove 643 for receiving the partition wall 633 in the processing cup 623 is formed in the vicinity of the upper end of the liquid recovery guide 642.

This guard 624 is provided with a guard lifting mechanism (not shown) composed of a ball-screw mechanism or the like. The guard lifting mechanism lifts and lowers the guard 624 between a recovery position in which the liquid recovery guide 642 is positioned opposite to outer edges of the substrate W held on the spin chuck 621 and a discharge position in which the liquid discharge guide groove 641 is positioned opposite to the outer edges of the substrate W held on the spin chuck 621. When the guard 624 is in the recovery position (i.e., the position of the guard shown in FIG. 4), the processing liquid splashed out from the substrate W is directed by the liquid recovery guide 642 to the liquid recovery space 632, and then recovered through the recovery pipe 635. On the other hand, when the guard 624 is in the discharge position, the processing liquid splashed out from the substrate W is directed by the liquid discharge guide groove 641 to the discharge space 631, and then discharged through the discharge pipe 634. With such a configuration, discharge and recovery of the processing liquid is performed.

The processing operation of the washing processing unit SOAK having the aforementioned configuration is next described. Note that the operation of each component in the washing processing unit SOAK described below is controlled by the main controller 30 in FIG. 1.

When the substrate W is initially carried into the washing processing unit SOAK, the guard 624 is lowered, and the fourth central robot CR4 in FIG. 1 places the substrate W onto the spin chuck 621. The substrate W on the spin chuck 621 is held by suction.

Next, the guard 624 moves to the aforementioned discharge position, and the nozzle 650 moves above the center of the substrate W. Then, the rotation shaft 625 rotates, causing the substrate W held on the spin chuck 621 to rotate. After this, the washing liquid is discharged onto the top surface of the substrate W from the nozzle 650. The substrate W is thus washed, and part of the component of the resist on the substrate W is eluted in the washing liquid. During the washing, the substrate W is rotated as the washing liquid is supplied onto the substrate W. This causes the washing liquid on the substrate W to constantly move toward a peripheral portion of the substrate W by the centrifugal force, and splashed away. It is therefore possible to prevent the component of the resist eluted in the washing liquid from remaining on the substrate W. Note that the aforementioned resist component may be eluted with pure water being poured onto the substrate W and kept thereon for a certain period. The supply of the washing liquid onto the substrate W may also be executed by a soft spray method using a two-fluid nozzle.

After the elapse of a predetermined time, the supply of the washing liquid is stopped, and the rinse liquid is discharged from the nozzle 650. The washing liquid on the substrate W is thus washed away. As a result, it is possible to reliably prevent the resist components eluted in the washing liquid from remaining on the substrate W.

Figure 5:
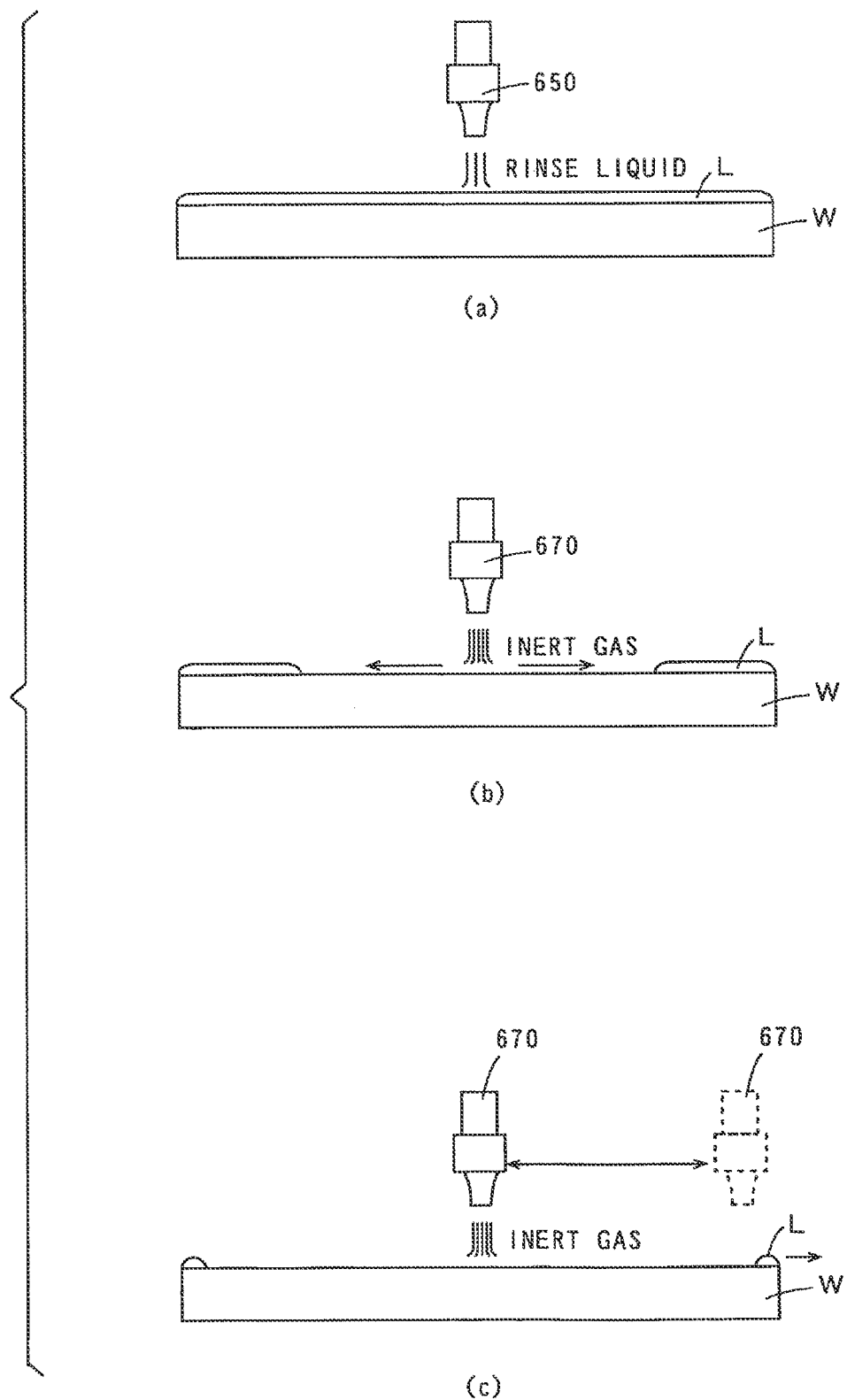
FIGS. 5 (*a*), 5 (*b*), and 5 (*c*) are diagrams for use in illustrating the operation of the washing processing unit.

After the elapse of another predetermined time, the rotation speed of the rotation shaft 625 decreases. This reduces the amount of the rinse liquid that is shaken off by the rotation of the substrate W, resulting in the formation of a liquid layer L of the rinse liquid over the entire surface of the substrate W, as shown in FIG. 5 (*a*). Alternatively, the rotation of the rotation shaft 625 may be stopped to form the liquid layer L over the entire surface of the substrate W.

The embodiment employs the configuration in which the nozzle 650 is used for supplying both the washing liquid and the rinse liquid, so as to supply both the washing liquid and the rinse liquid from the nozzle 650. However, a configuration may also be employed in which nozzles are separately provided for supplying the washing liquid and the rinse liquid.

In order to prevent the rinse liquid from flowing to the back surface of the substrate W during the supply of the rinse liquid, pure water may be supplied to the back surface of the substrate W using a back rinsing nozzle (not shown).

Note that when using pure water as the washing liquid for washing the substrate W, it is not necessary to supply the rinse liquid.

The supply of the rinse liquid is subsequently stopped, and the nozzle 650 retracts to the predetermined position while the nozzle 670 moves above the center of the substrate W. The inert gas is subsequently discharged from the nozzle 670. This causes the rinse liquid around the center of the substrate W to move toward the peripheral portion of the substrate W, leaving the liquid layer L only on the peripheral portion, as shown in FIG. 5 (*b*).

Next, as the number of revolutions of the rotation shaft 625 (see FIG. 4) increases, the nozzle 670 gradually moves from above the center of the substrate W to above the peripheral portion thereof, as shown in FIG. 5 (*c*). This causes a great centrifugal force acting on the liquid layer L on the substrate W while allowing the inert gas to be sprayed toward the entire surface of the substrate W, thereby ensuring the removal of the liquid layer L on the substrate W. As a result, the substrate W can be reliably dried.

Then, the supply of the inert gas is stopped, and the nozzle 670 retracts to the predetermined position while the rotation of the rotation shaft 625 is stopped. After this, the guard 624 is lowered, and the fourth central robot CR4 in FIG. 1 carries the substrate W out of the washing processing unit SOAK. The processing operation of the washing processing unit SOAK is thus completed.

It is preferred that the position of the guard 624 during washing and drying processing is suitably changed according to the necessity of the recovery or discharge of the processing liquid.

Figure 6:
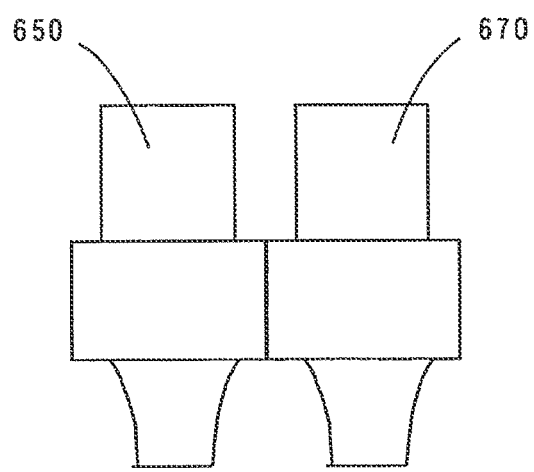
FIG. 6 is a schematic diagram of a nozzle in which a nozzle for washing processing and a nozzle for drying processing are formed integrally.

Moreover, although the washing processing unit SOAK shown in FIG. 4 includes the nozzle 650 for washing processing and the nozzle 670 for drying processing separately, the nozzle 650 and the nozzle 670 may also be formed integrally, as shown in FIG. 6. This obviates the need to move each of the nozzle 650 and the nozzle 670 separately during the washing or drying processing to the substrate W, thereby simplifying the driving mechanism.

Figure 7:
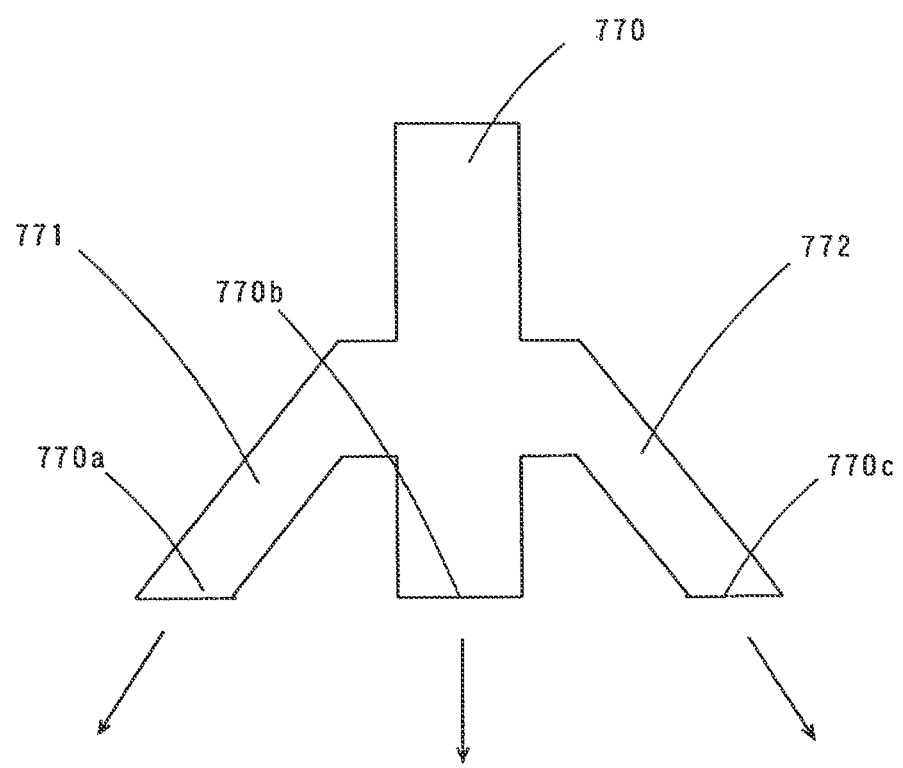
FIG. 7 is a schematic diagram showing another example of the nozzle for drying processing.

A nozzle 770 for drying processing as shown in FIG. 7 may also be used instead of the nozzle 670 for drying processing.

The nozzle 770 in FIG. 7 extends vertically downward, and also has branch pipes 771, 772 that extend obliquely downward from sides thereof. A gas discharge port 770*a* is formed at the lower end of the branch pipe 771, a gas discharge port 770*b* at the lower end of the nozzle 770, and a gas discharge port 770*c* at the lower end of the branch pipe 772, each for discharging an inert gas. The discharge port 770*b* discharges an inert gas vertically downward, and the discharge ports 770*a*, 770*c* each discharge an inert gas obliquely downward, as indicated by the arrows in FIG. 7. That is to say, the nozzle 770 discharges the inert gas so as to increase the spraying area downwardly.

Now, a washing processing unit SOAK using the nozzle 770 for drying processing applies drying processing to the substrate W as will be described below.

Figure 8:
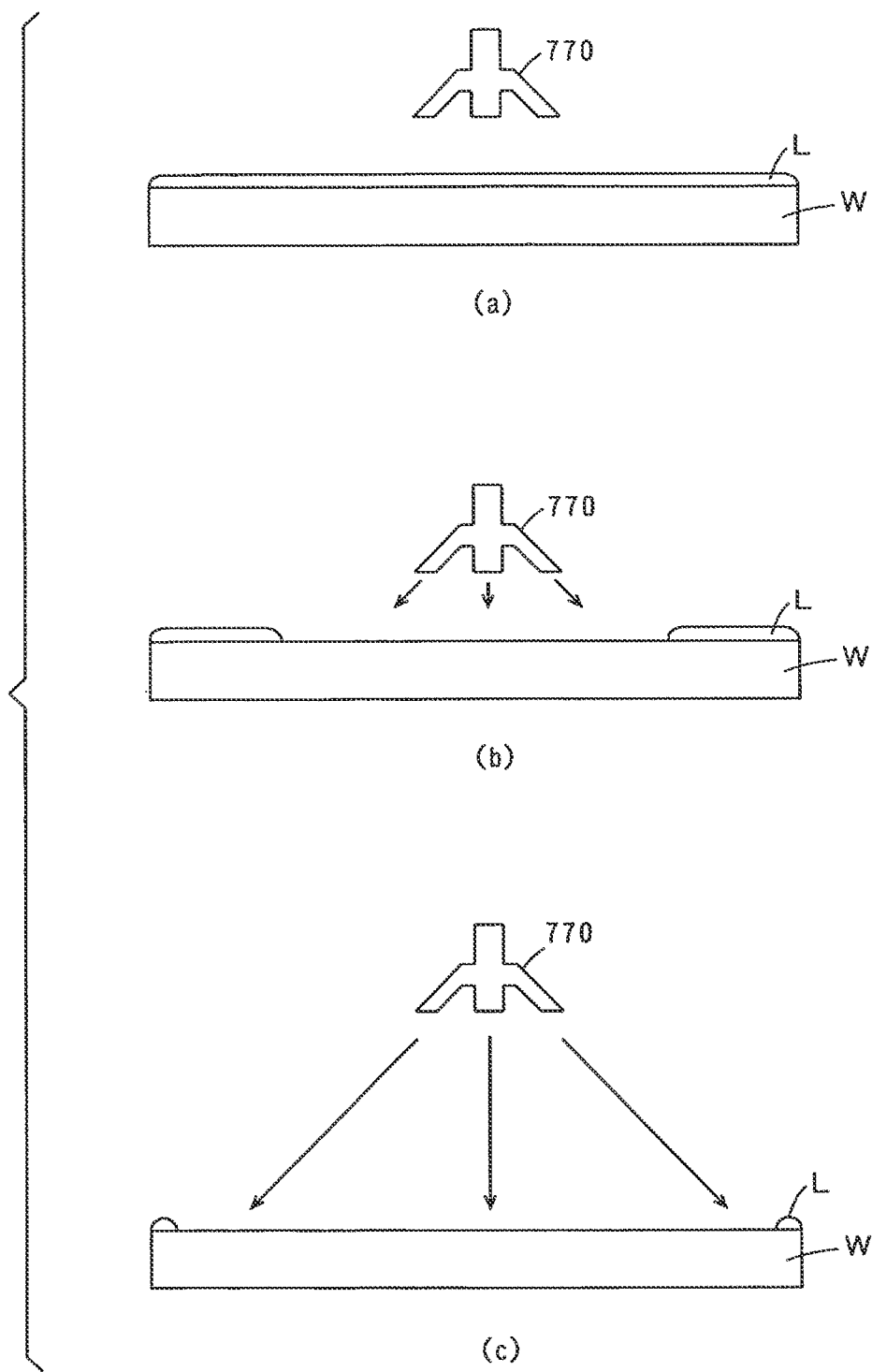
FIGS. 8 (*a*), 8 (*b*), and 8 (*c*) are diagrams for use in illustrating a method of applying drying processing to a substrate using the nozzle in FIG. 7.

FIGS. 8 (*a*), 8 (*b*), 8 (*c*) are diagrams for use in illustrating a method of applying drying processing to the substrate W using the nozzle 770.

Initially, a liquid layer L is formed on a surface of the substrate W by the method as described in FIG. 5 (*a*), and then the nozzle 770 moves above the center of the substrate W, as shown in FIG. 8 (*a*). After this, an inert gas is discharged from the nozzle 770. This causes the rinse liquid on the center of the substrate W to move to the peripheral portion of the substrate W, leaving the liquid layer L only on the peripheral portion of the substrate W, as shown in FIG. 8 (*b*). At the time, the nozzle 770 is brought close to the surface of the substrate W so as to reliably move the rinse liquid present on the center of the substrate W.

Next, as the number of revolutions of the rotation shaft 625 (see FIG. 4) increases, the nozzle 770 moves upward as shown in FIG. 8 (*c*). This causes a great centrifugal force acting on the liquid layer L on the substrate W while increasing the area to which the inert gas is sprayed on the substrate W. As a result, the liquid layer L on the substrate W can be reliably removed. Note that the nozzle 770 can be moved up and down by lifting and lowering the second rotation shaft 672 via a rotation shaft lifting mechanism (not shown) provided to the second rotation shaft 672 in FIG. 4.

Figure 9:
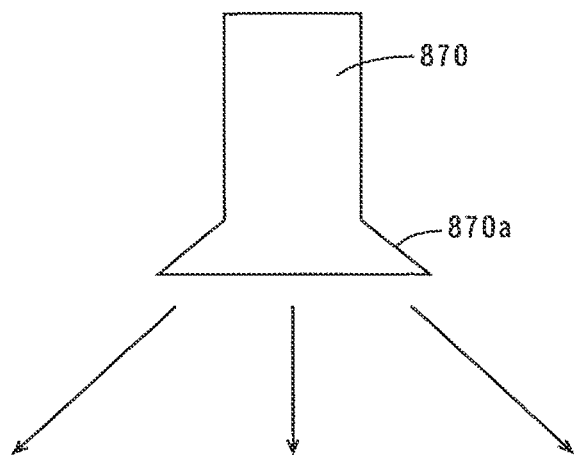
FIG. 9 is a schematic diagram showing another example of the nozzle for drying processing.

Alternatively, a nozzle 870 for drying processing as shown in FIG. 9 may be used instead of the nozzle 770. The nozzle 870 in FIG. 9 has a discharge port 870*a* whose diameter gradually increases downward. This discharge port 870*a* discharges an inert gas vertically downward and obliquely downward as indicated by the arrows in FIG. 9. That is, similarly to the nozzle 770 in FIG. 7, the nozzle 870 discharges the inert gas so as to increase the spraying area downwardly. Consequently, drying processing similar to that using the nozzle 770 can be applied to the substrate W using the nozzle 870.

Figure 10:
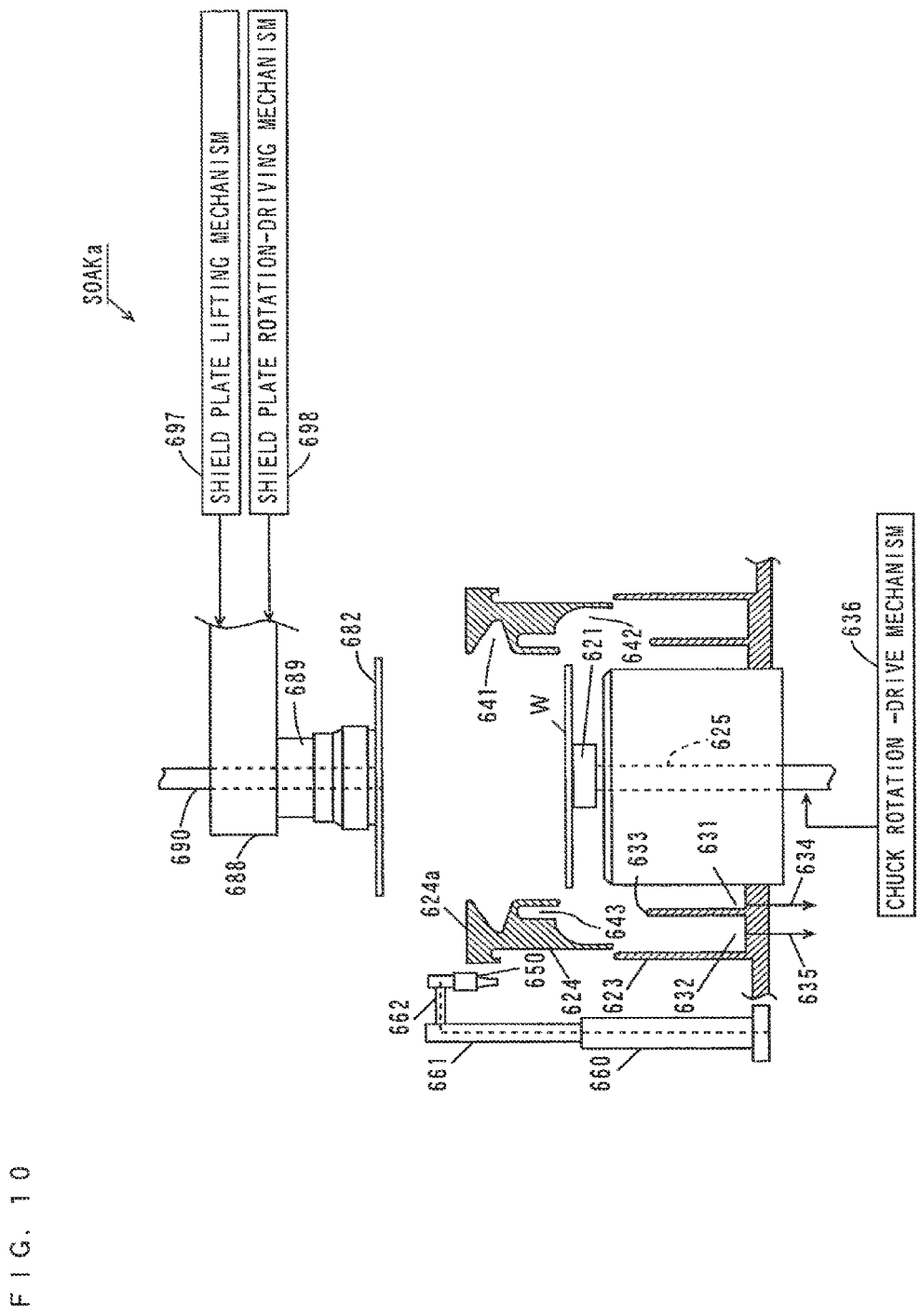
FIG. 10 is a schematic diagram showing another example of the drying processing unit.

A washing processing unit SOAKa as shown in FIG. 10 may also be used instead of the washing processing unit SOAK shown in FIG. 4.

The washing processing unit SOAKa in FIG. 10 is different from the washing processing unit SOAK in FIG. 4 as described below.

The washing processing unit SOAKa in FIG. 10 includes above the spin chuck 621*a* disk-shaped shield plate 682 having an opening through the center thereof. A support shaft 689 extends vertically downward from around an end of an arm 688, and the shield plate 682 is mounted at a lower end of the support shaft 689 so as to oppose the top surface of the substrate W held on the spin chuck 621.

A gas supply passage 690 that communicates with the opening of the shield plate 682 is inserted into the inside of the support shaft 689. A nitrogen gas ($N_2$), for example, is supplied into the gas supply passage 690.

The arm 688 is connected with a shield plate lifting mechanism 697 and a shield plate rotation-driving mechanism 698. The shield plate lifting mechanism 697 lifts and lowers the shield plate 682 between a position close to the top surface of the substrate W held on the spin chuck 621 and a position upwardly away from the spin chuck 621.

Figure 11:
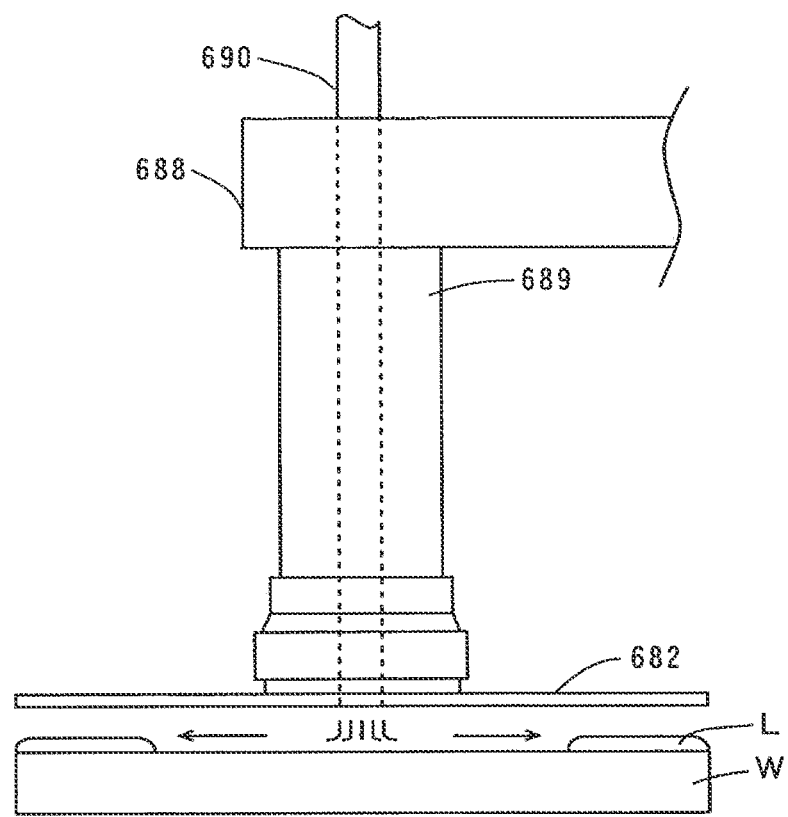
FIG. 11 is a diagram for use in illustrating a method of applying drying processing to the substrate using the drying processing unit in FIG. 10.

During the drying processing to the substrate W in the washing processing unit SOAKa in FIG. 10, with the shield plate 682 brought close to the substrate W as shown in FIG. 11, an inert gas is supplied to clearance between the substrate W and the shield plate 682 from the gas supply passage 690. This allows the inert gas to be efficiently supplied from the center of the substrate W to the peripheral portion thereof, thereby ensuring the removal of the liquid layer L on the substrate W.

Although in the above-described embodiment, the substrate W is subjected to drying processing by spin drying in the washing processing unit SOAK, the substrate W may be subjected to drying processing by other methods such as a reduced pressure drying method or an air knife drying method.

Although in the above-described embodiment, the inert gas is supplied from the nozzle 670 with the liquid layer L of the rinse liquid being formed, the following method may be applied when the liquid layer L of the rinse liquid is not formed or the rinse liquid is not used.

That is, the liquid layer of washing liquid is shaken off once by rotating the substrate W, and an inert gas is then immediately supplied from the nozzle 670 to thoroughly dry the substrate W.

As described above, in the substrate processing apparatus 500 according to the embodiment, the substrate W is subjected to the washing processing by the washing processing group 80 in the washing processing block 13 before the exposure processing by the exposure device 15. During this washing processing, part of the component of the resist on the substrate W is eluted in the washing liquid or the rinse liquid, and washed away. Therefore, even if the substrate W is in contact with liquid in the exposure device 15, the component of the resist on the substrate W is hardly eluted in the liquid. This prevents contamination inside the exposure device 15 while preventing the component of the resist eluted in the washing liquid from remaining on the substrate W.

Moreover, the washing processing unit SOAK applies the drying processing to the substrate W after the washing processing, which prevents the attachment of particles and the like in the atmosphere to the substrate W while transporting the substrate W after the washing processing. This prevents the contamination of the substrate W, which prevents the contamination inside the exposure device 15.

In addition, since the washing processing block 13 is arranged adjacent to the interface block 14, the substrate W is subjected to the washing processing immediately before the exposure processing by the exposure device 15. Therefore, this enables the transport route for the substrate W after the washing processing to the exposure device 15 to be shortened. This prevents the attachment of particles and the like in the atmosphere to the substrate W in the transport process after the washing processing, which prevents the contamination of the substrate W.

As a result of foregoing, the processing defects of the substrate W that may be generated in the exposure device 15 can be reduced.

Moreover, the washing processing unit SOAK applies the drying processing to the substrate W by spraying the inert gas onto the substrate W from the center to the peripheral portion thereof while rotating the substrate W. This ensures that the washing liquid and the rinse liquid are removed from the substrate W, which reliably prevents the attachment of particles and the like in the atmosphere on the washed substrate W. It is thus possible to reliably prevent the contamination of the substrate W and the generation of dry marks on the surface of the substrate W.

Also, it is possible to reliably prevent the washing liquid and the rinse liquid from remaining on the washed substrate W, which reliably prevents further elution of the resist component in the washing liquid and the rinse liquid during the transport of the substrate W from the washing processing unit SOAK to the exposure device 15. It is thus possible to reliably prevent a defective shape of the resist film and the contamination inside the exposure device 15.

As a result of the foregoing, processing defects of the substrate W can be reliably prevented.

In addition, since the substrate processing apparatus 500 according to the embodiment has the structure in which the washing processing block 13 is added to an existing substrate processing apparatus, processing defects that may be generated during the exposure processing and after the exposure processing can be reduced at low cost.

Figure 12:
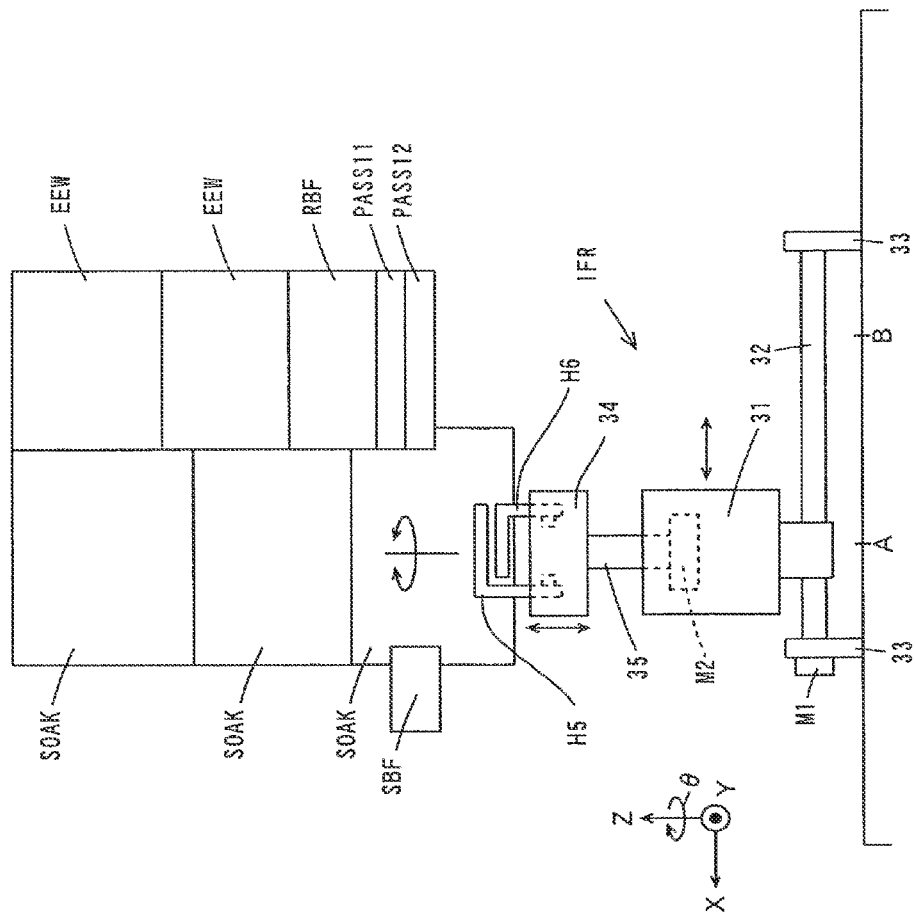
FIG. 12 is a diagram for use in illustrating the configuration and the operation of the interface transport mechanism.

The interface transport mechanism IFR is next described. FIG. 12 is a diagram for illustrating the configuration and the operation of the interface transport mechanism IFR.

The configuration of the interface transport mechanism IFR is first described. As shown in FIG. 12, the movable base 31 in the interface transport mechanism IFR is threadably mounted to a screwed shaft 32. The screwed shaft 32 is rotatably supported with support bases 33 so as to extend in the X direction. One end of the screwed shaft 32 is provided with a motor M1, which causes the screwed shaft 32 to rotate and the movable base 31 to horizontally move in the ±X direction A hand support base 34 is mounted on the movable base 31 so as to rotate in the ±θ direction while moving up and down in the ±Z direction. The hand support base 34 is coupled to a motor M2 in the movable base 31 through a rotation shaft 35, and rotated by the motor M2. Two hands H5, H6 for holding the substrate W in a horizontal attitude are mounted to the hand support base 34 one above the other, so as to move forward and backward.

The operation of the interface transport mechanism IFR is next described. The operation of the interface transport mechanism IFR is controlled by the main controller 30 in FIG. 1.

The interface transport mechanism IFR initially rotates the hand support base 34 at the position A in FIG. 12 while lifting the hand support base 34 in the +Z direction, to allow the upper hand H5 to enter the substrate platform PASS11. When the hand H5 has received the substrate W in the substrate platform PASS11, the interface transport mechanism IFR retracts the hand H5 from the substrate platform PASS11, and lowers the hand support base 34 in the −Z direction.

The interface transport mechanism IFR subsequently moves in the −X direction, and rotates the hand support base 34 at the position B while allowing the hand H5 to enter a substrate inlet 15a (see FIG. 1) in the exposure device 15. After the hand H5 has carried the substrate W into the substrate inlet 15a, the interface transport mechanism IFR retracts the hand H5 from the substrate inlet 15a.

Then, the interface transport mechanism IFR allows the lower hand H6 to enter a substrate inlet 15b (see FIG. 1) in the exposure device 15. When the hand H6 has received the substrate W in the substrate inlet 15b, the interface transport mechanism retracts the hand H6 from the substrate inlet 15b.

The interface transport mechanism IFR subsequently moves in the +X direction, and rotates the hand support base 34 at the position A to allow the hand H5 to enter the substrate platform PASS12 and transfer the substrate W onto the substrate platform PASS12.

If the exposure device 15 is not capable of receiving the substrate W during the transport of the substrate W from the substrate platform PASS11 to the exposure device 15, the substrate W is transported to the buffer unit SBF once, and waits there until the exposure device 15 becomes capable of receiving the substrate W.

As described above, in this embodiment, the interface transport mechanism IFR employs the hand H5 during the transport of the substrate W from the substrate platform PASS11 to the exposure device 15, and employs the hand H6 when carrying the substrate W from the exposure device 15 to the substrate platform PASS12. That is, the hand H6 is used in transporting the substrate W to which a liquid is attached after the exposure processing, and the hand H5 is used in transporting the substrate W to which no liquid is attached before the exposure processing. This prevents the liquid on the substrate W from attaching to the hand H5.

Moreover, the hand H6 is arranged below the hand H5, so that even if a liquid drops from the hand H6 and the substrate W held thereon, the liquid will not attach to the hand H5 and the substrate W held thereon.

Furthermore, as described above, the fifth central robot CR5 also employs the lower hand CRH10 during the transport of the substrate W to which a liquid is attached after the exposure processing (between the substrate platform PASS12 and the thermal processing group 131), and employs the upper hand CRH9 during the transport of the substrate W to which no liquid is attached before the exposure processing (between the substrate platform PASS9 and the edge exposure units EEW, and between the edge exposure units EEW and the substrate platform PASS11). This prevents a liquid from attaching to the substrate W before the exposure processing also in the fifth central robot CR5.

As a result of the foregoing, a liquid is prevented from attaching to the substrate W before the exposure processing, which prevents the contamination of the substrate W due to the attachment of particles and the like in the atmosphere. This prevents the generation of processing defects of the substrate W of the exposure device 15.

Although in this embodiment, the single interface transport mechanism IFR is used for transporting the substrate W from the substrate platform PASS11 to the exposure device 15, from the exposure device 15 to the substrate platform PASS12, a plurality of interface transport mechanisms IFR may also be used for transporting the substrate W.

The operation and the configuration of the interface transport mechanism IFR may also be modified according to the positions of the substrate inlet 15a and the substrate outlet 15b of the exposure device 15. For example, where the substrate inlet 15a and the substrate outlet 15b of the exposure device 15 are positioned opposite to the position A in FIG. 12, the screwed shaft 32 of FIG. 12 may not be provided.

Furthermore, the numbers of the coating units BARC, RES, the development processing units DEV, the washing processing units SOAK, the heating units HP, and the cooling units CP may suitably be changed according to the processing speed of each processing block.

Figure 13:
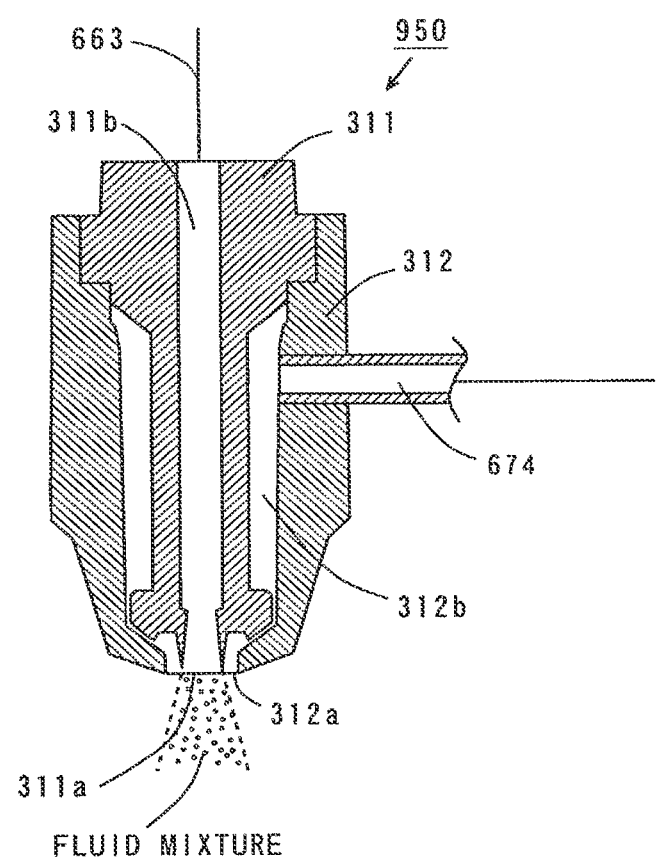
FIG. 13 is a longitudinal cross section showing an example of the internal structure of a two-fluid nozzle for use in washing and drying processing.

Furthermore, a two-fluid nozzle shown in FIG. 13 may also be used in the washing processing unit SOAK, instead of one or both the nozzle 650 for washing processing and the nozzle 670 for drying processing shown in FIG. 4

FIG. 13 is a longitudinal cross section showing an example of the internal structure of the two-fluid nozzle 950 for use in washing and drying processing. The two-fluid nozzle 950 is capable of selectively discharging a gas, a liquid, and a fluid mixture of the gas and liquid.

The two-fluid nozzle 950 in this embodiment is so-called an external-mix type. The external-mix type two-fluid nozzle 950 shown in FIG. 13 comprises an inner body portion 311 and an outer body portion 312. The inner body portion 311 is composed of, e.g., quartz, and the outer body portion 312 is composed of a fluororesin such as PTFE (polytetrafluoroethylene).

A cylindrical liquid passage 311b is formed along the central axis of the inner body portion 311. The liquid passage 311b is provided with the supply pipe 663 shown in FIG. 4 for washing processing. Washing liquid or rinse liquid supplied from the supply pipe 663 is thus introduced into the liquid passage 311b.

A liquid discharge port 311a that communicates with the liquid passage 311b is formed at a lower end of the inner body portion 311. The inner body portion 311 is inserted into the outer body portion 312. Upper ends of the inner body portion 311 and the outer body portion 312 are joined together, while lower ends thereof are not joined.

A cylindrical gas passage 312b is formed between the inner body portion 311 and the outer body portion 312. A gas discharge port 312a that communicates with the gas passage 312b is formed at the lower end of the outer body portion 312. The supply pipe 674 shown in FIG. 4 for drying processing is mounted to a peripheral wall of the outer body portion 312, so as to communicate with the gas passage 312b. An inert gas supplied from the supply pipe 674 is thus introduced into the gas passage 312b.

The diameter of the gas passage 312b decreases downward in the vicinity of the gas discharge port 312a. As a result, the velocity of flow of the inert gas is accelerated, and the inert gas is discharged from the gas discharge port 312a.

The washing liquid discharged from the liquid discharge port 311a and the inert gas discharged from the gas discharge port 312a are mixed outside near the lower end of the two-fluid nozzle 950 to generate a mist-like fluid mixture that contains fine droplets of the washing liquid.

Figure 14:
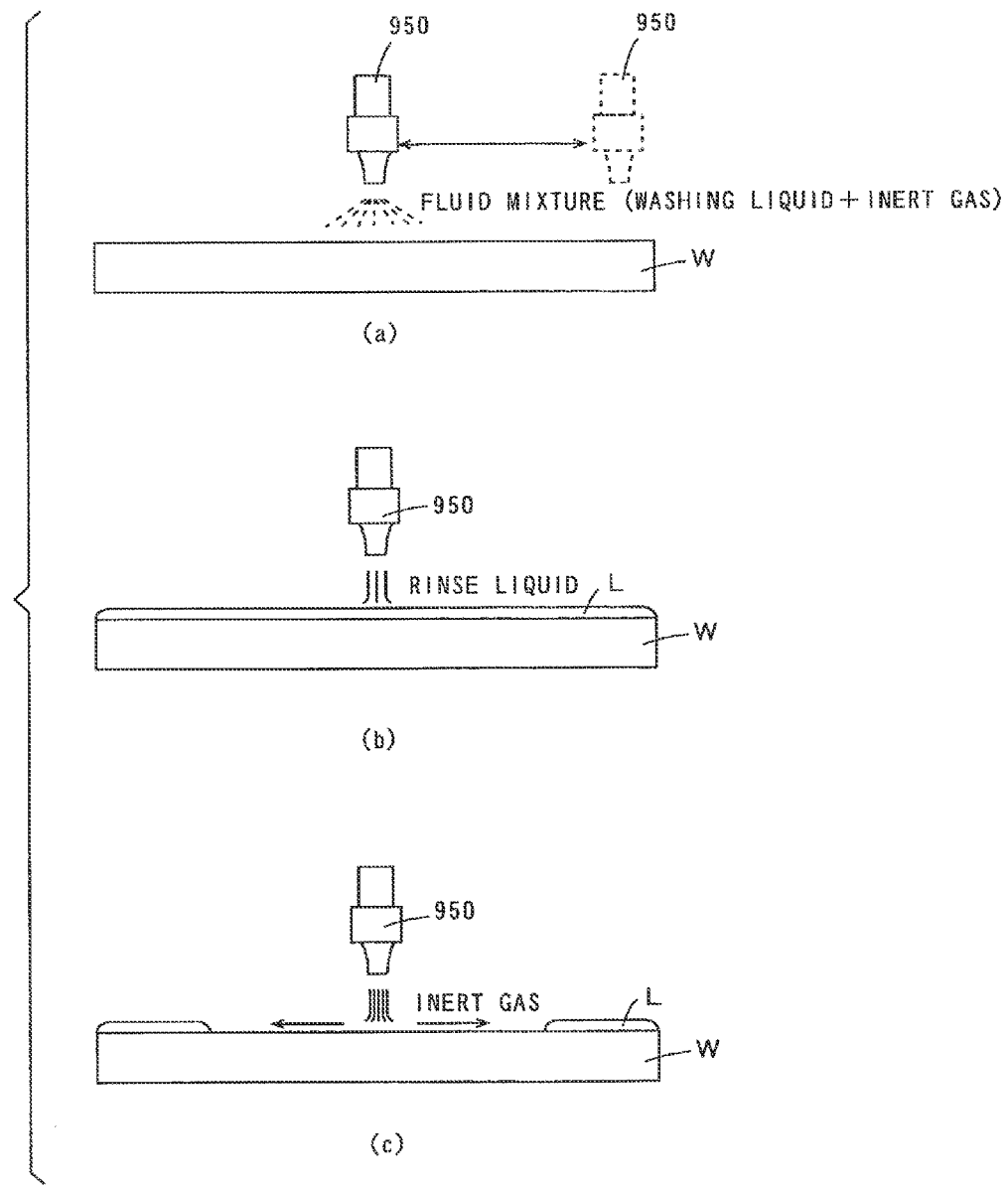
FIGS. 14 (*a*), 14 (*b*), and 14 (*c*) are diagrams for use in illustrating a method of applying drying processing to the substrate using the two-fluid nozzle in FIG. 13.

FIGS. 14 (a), 14 (b), 14 (c) are diagrams for use in illustrating a method of applying drying processing to the substrate W using the two-fluid nozzle 950 in FIG. 13.

The substrate W is initially held on the spin chuck 621 by suction, as shown in FIG. 4, and rotates together with the rotation of the rotation shaft 625. The rotation speed of the rotation shaft 625 is, e.g., about 500 rpm.

In this state, as shown in FIG. 14 (a), the two-fluid nozzle 950 discharges the mist-like fluid mixture of the washing liquid and the inert gas onto the top surface of the substrate W while gradually moving from above the center of the substrate W to above the peripheral portion thereof. In this way, the fluid mixture is sprayed onto the entire surface of the substrate W from the two-fluid nozzle 950 to wash the substrate W.

Next, the supply of the fluid mixture is stopped, and the rotation speed of the rotation shaft 625 decreases while the rinse liquid is discharged from the two-fluid nozzle 950 onto the substrate W, as shown in FIG. 14 (b). The rotation speed of the rotation shaft 625 is, e.g., about 10 rpm. A liquid layer L of the rinse liquid is thus formed on the entire surface of the substrate W. Alternatively, the rotation of the rotation shaft 625 may be stopped to form the liquid layer L on the entire surface of the substrate W. When pure water is used as the washing liquid in the fluid mixture for washing the substrate W, the supply of the rinse liquid may be omitted.

After the formation of the liquid layer L, the supply of the rinse liquid is stopped. Then, the inert gas is discharged onto the substrate W from the two-fluid nozzle 950, as shown in FIG. 14 (c). This causes the washing liquid on the center of the substrate W to move to the peripheral portion of the substrate W, leaving the liquid layer L only on the peripheral portion.

Then, the rotation speed of the rotation shaft 625 increases. The rotation speed of the rotation shaft 625 is, e.g., about 100 rpm. This causes a great centrifugal force acting on the liquid layer L on the substrate W, allowing the removal of the liquid layer L on the substrate W. As a result, the substrate W is dried.

The two-fluid nozzle 950 may gradually move from above the center of the substrate W to above the peripheral portion thereof when removing the liquid layer L on the substrate W. This allows the inert gas to be sprayed to the entire surface of the substrate W, which ensures the removal of the liquid layer L on the substrate W. As a result, the substrate W can be reliably dried.

As described above, the fluid mixture discharged from the two-fluid nozzle 950 contains fine droplets of the washing liquid. Therefore, even if the surface of the substrate W has irregularities, any contaminants attached on the surface of the substrate W can be stripped off. The contaminants on the surface of the substrate W can thus be reliably removed. Moreover, even if the films on the substrate W have low wettability, the fine droplets of the washing liquid strip off the contaminants on the surface of the substrate W, so that the contaminants can be reliably removed from the surface of the substrate W.

As a result, even if the solvent or the like in a resist is sublimated in the thermal processing units HP and the sublimates are attached to the substrate W again when thermal processing is applied to the substrate W by the thermal processing units HP before the exposure processing, the sublimates attached to the substrate W can be reliably removed by the washing processing units SOAK. It is therefore possible to reliably prevent the contamination inside the exposure device 14.

In addition, adjusting the flow rate of the inert gas allows adjustments to be easily made to the detergency in washing the substrate W. Thus, when the organic films (i.e., a resist film) on the substrate W are prone to damage, damage to the organic films on the substrate W can be prevented by weakening the detergency. Tough contaminants on the surface of the substrate W can also be removed reliably by strengthening the detergency. By adjusting the detergency in this way according to the properties of the organic films on the substrate W and the degree of contamination, it is possible to prevent damage to the organic films on the substrate W and wash the substrate W reliably.

Moreover, the external-mix type two-fluid nozzle 950 generates the fluid mixture by mixing the washing liquid and the inert gas outside the two-fluid nozzle 950. The inert gas and the washing liquid flow through the separate flow passages, respectively, in the two-fluid nozzle 950. This prevents the washing liquid from remaining in the gas passage 312*b*, allowing the inert gas to be discharged independently from the two-fluid nozzle 950. Also, the rinse liquid can be discharged independently from the two-fluid nozzle 950 by supplying the rinse liquid from the supply pipe 663. This allows the fluid mixture, the inert gas, and the rinse liquid to be selectively discharged from the two-fluid nozzle 950.

Furthermore, the use of the two-fluid nozzle 950 obviates the need to provide nozzles for supplying the washing liquid or the rinse liquid to the substrate W and for supplying the inert gas to the substrate W separately. This provides reliable washing and drying of the substrate W with a simple structure.

Although, in this embodiment, the two-fluid nozzle 950 is used to supply the rinse liquid to the substrate W, a separate nozzle may also be used for supplying the rinse liquid to the substrate W.

Moreover, in this embodiment, although the two-fluid nozzle 950 is used to supply the inert gas to the substrate W, a separate nozzle may also be used for supplying the inert gas to the substrate W.

In this embodiment, the anti-reflection film processing block 10, the resist film processing block 11, the development processing block 12, and the washing processing block 13 correspond to a processing section; the interface block 14 corresponds to an interface; the indexer block 9 corresponds to an indexer; the coating units RES correspond to a first processing unit; the resist film processing block 11 corresponds to a first processing block; the development processing units DEV correspond to a second processing unit; the development processing block 12 corresponds to a second processing block; the washing processing units SOAK, SOAKa correspond to a third processing unit; the washing processing block 13 corresponds to a third processing block; the coating units BARC correspond to a fourth processing unit; the anti-reflecting film processing block 10 corresponds to a fourth processing block; and the resist film correspond to a photosensitive film.

The heating units HP and the cooling units CP correspond to a first to fourth thermal processing units; the second central robot CR2 corresponds to a first transport unit; the third central robot CR3 corresponds to a second transport unit; the fourth central robot CR4 corresponds to a third transport unit; the first central robot CR1 corresponds to a fourth transport unit; the fifth central robot CR5 corresponds to a fifth transport unit; the interface transport mechanism IFR corresponds to a sixth transport unit; the hand CRH9 corresponds to a first holder; the hand CRH10 corresponds to a second holder; the hand H5 corresponds to a third holder; the hand H6 corresponds to a fourth holder; and the platforms PASS11, PASS12 correspond to a platform.

The spin chuck 621 corresponds to a substrate holding device; the rotation shaft 625 and the chuck rotation-drive mechanism 636 correspond to a rotation-drive device; the nozzle 650 for washing processing corresponds to a washing liquid supplier and a rinse liquid supplier; and the nozzles 670, 770, 870 for drying processing correspond to an inert gas supplier.

The two-fluid nozzle 950 corresponds to a fluid nozzle; the liquid passage 311*b* corresponds to a liquid flow passage; and the gas passage 312*b* corresponds to a gas flow passage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of processing a substrate in a substrate processing apparatus that is arranged adjacent to an exposure device that applies exposure processing to a substrate by a liquid immersion method, and includes first, second and third processing units, the method comprising the steps of:

forming a photosensitive film made of a photosensitive material on an upper surface of the substrate by the first processing unit before the exposure processing by the exposure device;

rotating the substrate about an axis vertical to the substrate while holding the substrate substantially horizontally in the second processing unit after the formation of the photosensitive film by the first processing unit and before the exposure processing by the exposure device;

forming a liquid layer of a rinse liquid on a whole upper surface of the photosensitive film on the rotated substrate, to previously allow part of a component of the photosensitive material within the photosensitive film to be eluted in the liquid layer from within the photosensitive film in the second processing unit such that the component of the photosensitive material within the photosensitive film is not eluted from within the photosensitive film on the substrate during the exposure processing by the exposure device;

removing the liquid layer on the photosensitive film after the part of the component of the photosensitive material is eluted;

transporting the substrate after the removal of the liquid layer to the exposure device to apply the exposure processing to the photosensitive film on the substrate by the exposure device; and applying development processing to the substrate by the third processing unit after the exposure processing by the exposure device.

2. The substrate processing method according to claim 1, wherein the step of forming the liquid layer of the rinse liquid includes forming the liquid layer of the rinse liquid having an upper surface that is exposed to atmosphere and in a free state on the upper surface of the photosensitive film on the substrate.

3. The substrate processing method according to claim 1, further comprising the step of applying thermal processing to the photosensitive film on the substrate after the formation of the photosensitive film by the first processing unit and before the exposure processing by the exposure device, wherein the step of forming the liquid layer of the rinse liquid includes forming the liquid layer of the rinse liquid on a dried surface of the photosensitive film on the substrate after the thermal processing and before the exposure processing by the exposure device.

4. A method of processing a substrate in a substrate processing apparatus that is arranged adjacent to an exposure device that applies exposure processing to a substrate by a liquid immersion method, and includes first, second and third processing units, the method comprising the steps of:

forming a photosensitive film made of a photosensitive material on an upper surface of the substrate by the first processing unit before the exposure processing by the exposure device;

rotating the substrate about an axis vertical to the substrate while holding the substrate substantially horizontally in the second processing unit after the formation of the photosensitive film by the first processing unit and before the exposure processing by the exposure device;

supplying a rinse liquid onto the photosensitive film on the rotated substrate such that a liquid layer of the rinse liquid is formed on a whole upper surface of the photosensitive film on the substrate in the second processing unit;

holding the liquid layer on the upper surface of the photosensitive film on the rotated substrate such that part of a component of the photosensitive material within the photosensitive film is eluted in the liquid layer from within the photosensitive film;

removing the liquid layer on the photosensitive film in the second processing unit after the part of the component of the photosensitive material is eluted;

transporting the substrate after the removal of the liquid layer to the exposure device to apply the exposure processing to the photosensitive film on the substrate by the exposure device; and applying development processing to the substrate by the third processing unit after the exposure processing by the exposure device.

5. A method of processing a substrate in a substrate processing apparatus that is arranged adjacent to an exposure device that applies exposure processing to a substrate by a liquid immersion method, and includes first, second and third processing units, the method comprising the steps of:

forming a photosensitive film made of a photosensitive material on an upper surface of the substrate by the first processing unit before the exposure processing by the exposure device;

rotating the substrate about an axis vertical to the substrate while holding the substrate substantially horizontally in the second processing unit after the formation of the photosensitive film by the first processing unit and before the exposure processing by the exposure device;

forming a liquid layer of a rinse liquid on a whole upper surface of the photosensitive film on the rotated substrate by supplying the rinse liquid onto the photosensitive film on the substrate such that part of a component of the photosensitive material of the photosensitive film is eluted in the liquid layer in the second processing unit;

stopping the supply of the rinse liquid after the formation of the liquid layer;

removing the liquid layer on the photosensitive film after the stopping of the supply of the rinse liquid;

transporting the substrate after the removal of the liquid layer to the exposure device to apply the exposure processing to the photosensitive film on the substrate by the exposure device; and applying development processing to the substrate by the third processing unit after the exposure processing by the exposure device, wherein the step of forming the liquid layer includes previously allowing the part of the component of the photosensitive material within the photosensitive film to be eluted in the liquid layer from within the photosensitive film such that the component of the photosensitive material within the photosensitive film is not eluted from within the photosensitive film on the substrate during the exposure processing by the exposure device.

* * * * *